US012169216B2

(12) United States Patent
Tachi

(10) Patent No.: US 12,169,216 B2
(45) Date of Patent: Dec. 17, 2024

(54) SEMICONDUCTOR DEVICE AND INSPECTION METHOD

(71) Applicant: ROHM CO., LTD., Kyoto (JP)

(72) Inventor: Tsuyoshi Tachi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 87 days.

(21) Appl. No.: 17/584,673

(22) Filed: Jan. 26, 2022

(65) Prior Publication Data

US 2022/0244305 A1 Aug. 4, 2022

(30) Foreign Application Priority Data

Feb. 2, 2021 (JP) ................. 2021-014913

(51) Int. Cl.
G01R 31/26 (2020.01)
H01L 23/00 (2006.01)
H01L 23/31 (2006.01)
H01L 23/495 (2006.01)

(52) U.S. Cl.
CPC ...... *G01R 31/2607* (2013.01); *H01L 23/3121* (2013.01); *H01L 23/49548* (2013.01); *H01L 23/49562* (2013.01); *H01L 24/48* (2013.01); *H01L 2224/48175* (2013.01)

(58) Field of Classification Search
CPC ............ G01R 31/2607; H01L 23/3121; H01L 23/49548; H01L 23/49562; H01L 24/48; H01L 2224/48175
See application file for complete search history.

(56) References Cited

U.S. PATENT DOCUMENTS

| 8,120,128 | B2* | 2/2012 | Matsumoto | ............ | H04N 23/57 |
| | | | | | 257/E31.127 |
| 2007/0210422 | A1* | 9/2007 | Chow | ............... | H01L 23/49548 |
| | | | | | 257/666 |
| 2016/0293543 | A1 | 10/2016 | Otremba | | |
| 2018/0138134 | A1* | 5/2018 | Chikamatsu | ...... | H01L 23/49568 |
| 2019/0304879 | A1* | 10/2019 | Saito | ......................... | C25D 7/12 |
| 2020/0251409 | A1* | 8/2020 | Saito | ....................... | H01L 24/06 |
| 2020/0350235 | A1* | 11/2020 | Michikoshi | ....... | H01L 23/49562 |

FOREIGN PATENT DOCUMENTS

| JP | H5-41435 A | | 2/1993 |
| JP | 2007155640 A | * | 6/2007 |

* cited by examiner

*Primary Examiner* — Feba Pothen
(74) *Attorney, Agent, or Firm* — HSML P.C.

(57) ABSTRACT

A semiconductor device includes: a semiconductor element having an element main surface and first and second electrodes arranged on the element main surface; a first lead mounting the semiconductor element thereon; a second lead electrically connected to the first electrode; a third lead electrically connected to the second electrode; first connecting portions bonded to the first electrode and the second lead; and a sealing resin covering the semiconductor element, wherein the sealing resin includes a resin main surface facing the same side as the element main surface and a resin side surface connected to the resin main surface, the second lead includes a portion exposed from the sealing resin, the third lead includes a portion exposed from the sealing resin, and the exposed portion of the second lead includes a portion located on a side of the resin main surface with respect to the exposed portion of the third lead.

16 Claims, 18 Drawing Sheets

SEMICONDUCTOR DEVICE AND INSPECTION METHOD

CROSS-REFERENCE TO RELATED APPLICATION

This application is based upon and claims the benefit of priority from Japanese Patent Application No. 2021-014913, filed on Feb. 2, 2021, the entire contents of which are incorporated herein by reference.

TECHNICAL FIELD

The present disclosure relates to a semiconductor device and an inspection method.

BACKGROUND

Various configurations have been proposed for a semiconductor device including a semiconductor element. As an example of the semiconductor device, there is a semiconductor device in which a semiconductor element mounted on a die pad is connected to leads by wires and these components are covered with a sealing resin. In recent years, a semiconductor device is required to become smaller and have a larger capacity. In order to realize these requirements, it is necessary to operate the semiconductor device at a high temperature. Therefore, wire bonding portions are required to have higher reliability than before. If the deterioration of a wire bonding state can be detected in an actual use state in which a semiconductor device is mounted on a circuit board, the semiconductor device can be repaired or replaced to prevent a system failure caused by the semiconductor device.

There is known an inspection method of determining a wire bonding state in a semiconductor device based on a resistance value. Even in the actual use state of the semiconductor device, the deterioration of a wire bonding state can be detected by monitoring a voltage change in a steady state. However, in this case, a change in resistance due to a temperature change caused by self-heating of the semiconductor device is unavoidable. Since it is difficult to determine the change in resistance due to the temperature change, the accuracy of detecting the deterioration of the wire bonding state is low.

SUMMARY

Some embodiments of the present disclosure provide an inspection method capable of detecting deterioration of a wire bonding state with high accuracy in a state in which a semiconductor device is mounted on a circuit board, and a semiconductor device appropriate for the inspection method.

According to one embodiment of the present disclosure, there is provided an inspection method of inspecting a bonding state of a plurality of first connecting portions bonded to a source terminal of a semiconductor device, which includes a gate terminal, the source terminal, and a sense source terminal, in a state in which the semiconductor device is mounted on a circuit board, the inspection method including: a signal input process of inputting a pulse signal to the gate terminal; a voltage detection process of detecting a sense voltage which is a voltage of the sense source terminal with respect to the source terminal; and a comparison process of comparing the sense voltage at a turn-off time of the pulse signal with a threshold voltage.

According to another embodiment of the present disclosure, there is provided a semiconductor device including: a semiconductor element having an element main surface and an element back surface facing opposite each other in a thickness direction, and first and second electrodes arranged on the element main surface; a first lead on which the semiconductor element is mounted; a second lead arranged to be spaced apart from the first lead and electrically connected to the first electrode; a third lead arranged to be spaced apart from the first lead and the second lead and electrically connected to the second electrode; a plurality of first connecting portions bonded to the first electrode and the second lead; and a sealing resin configured to cover the semiconductor element, wherein the sealing resin includes a resin main surface facing the same side as the element main surface, a resin back surface facing the same side as the element back surface, and a resin side surface connected to the resin main surface and the resin back surface, wherein the second lead includes a second lead exposed portion exposed from the sealing resin, wherein the third lead includes a third lead exposed portion exposed from the sealing resin, and wherein the second lead exposed portion includes a portion located on a side of the resin main surface with respect to the third lead exposed portion.

Other features and advantages of the present disclosure will become more apparent with the detailed description given below based on the accompanying drawings.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, preferred embodiments of the present disclosure will be specifically described with reference to the accompanying drawings.

In the present disclosure, "a certain object A being formed in a certain object B" and "a certain object A being formed on a certain object B" include "the certain object A being formed directly in the certain object B" and "the certain object A being formed in the certain object B with another object interposed between the certain object A and the certain object B," unless otherwise specified. Similarly, "a certain object A being arranged in a certain object B" and "a certain object A being arranged on a certain object B" include "the certain object A being arranged directly in the certain object B" and "the certain object A being arranged in the certain object B with another object interposed between the certain object A and the certain object B," unless otherwise specified. Similarly, "a certain object A being positioned on a certain object B" includes "the certain object A being positioned on the certain object B with the certain object A in contact with the certain object B" and "the certain object A being positioned on the certain object B with another object interposed between the certain object A and the certain object B," unless otherwise specified. In addition, "a certain object A being overlapped with a certain object B as viewed in a certain direction" includes "the certain object A being overlapped with the entirety of the certain object B" and "the certain object A being overlapped with a part of the certain object B," unless otherwise specified.

First Embodiment

A semiconductor device A1 according to a first embodiment of the present disclosure will be described with reference to FIGS. 1 to 7. The semiconductor device A1 includes leads 1 to 4, a semiconductor element 6, wires 71 to 73, and a sealing resin 8.

Figure 1:
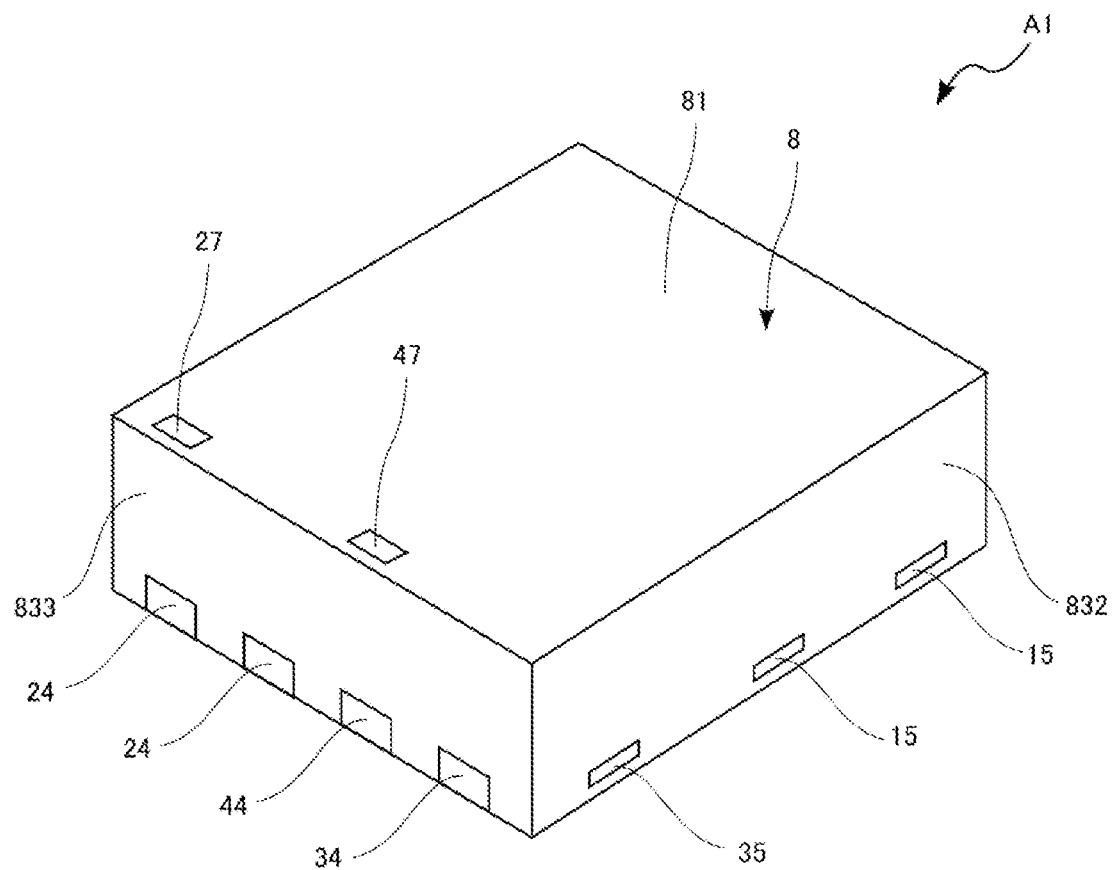
FIG. 1 is a perspective view showing a semiconductor device according to a first embodiment of the present disclosure.
Figure 1:
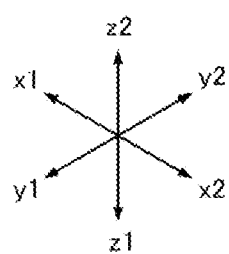
Figure 2:
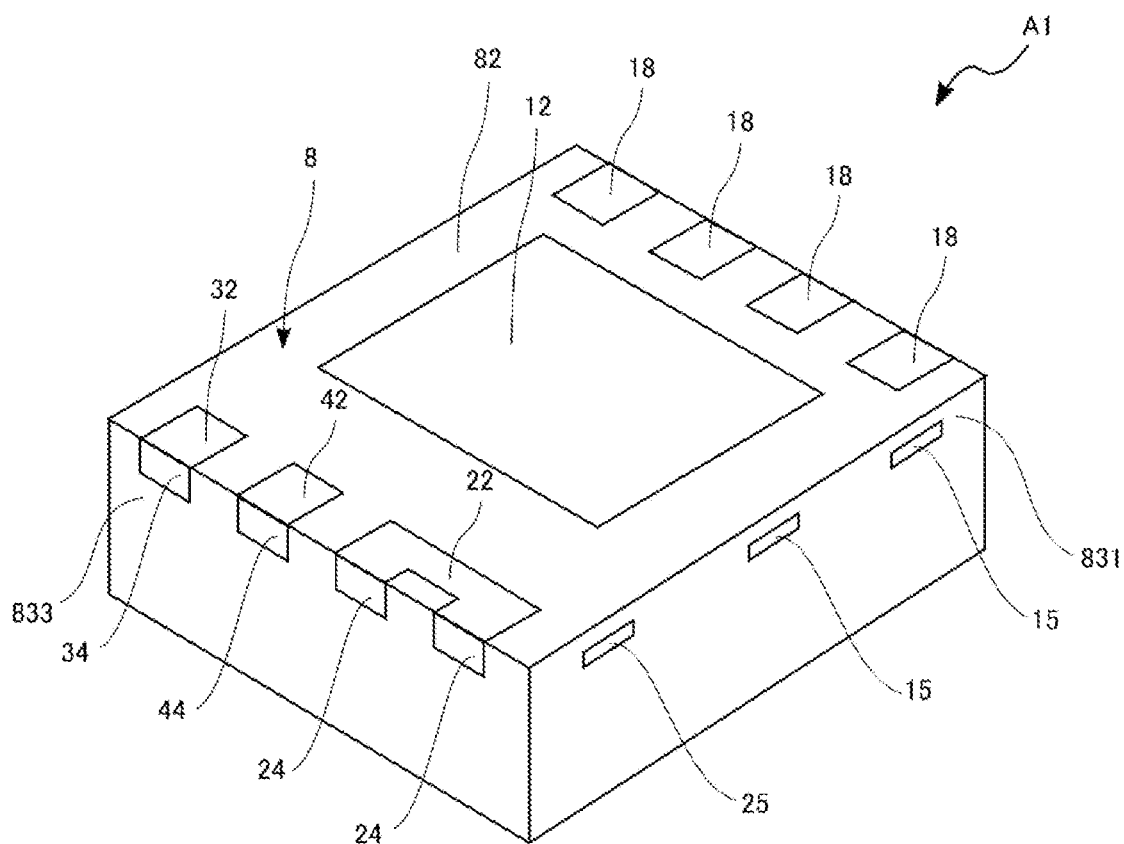
FIG. 2 is a perspective view of the semiconductor device shown in FIG. 1 with a bottom surface side thereof facing upward.
Figure 2:
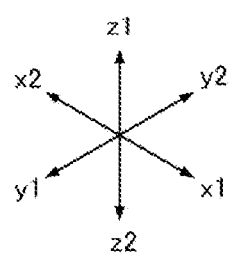
Figure 3:
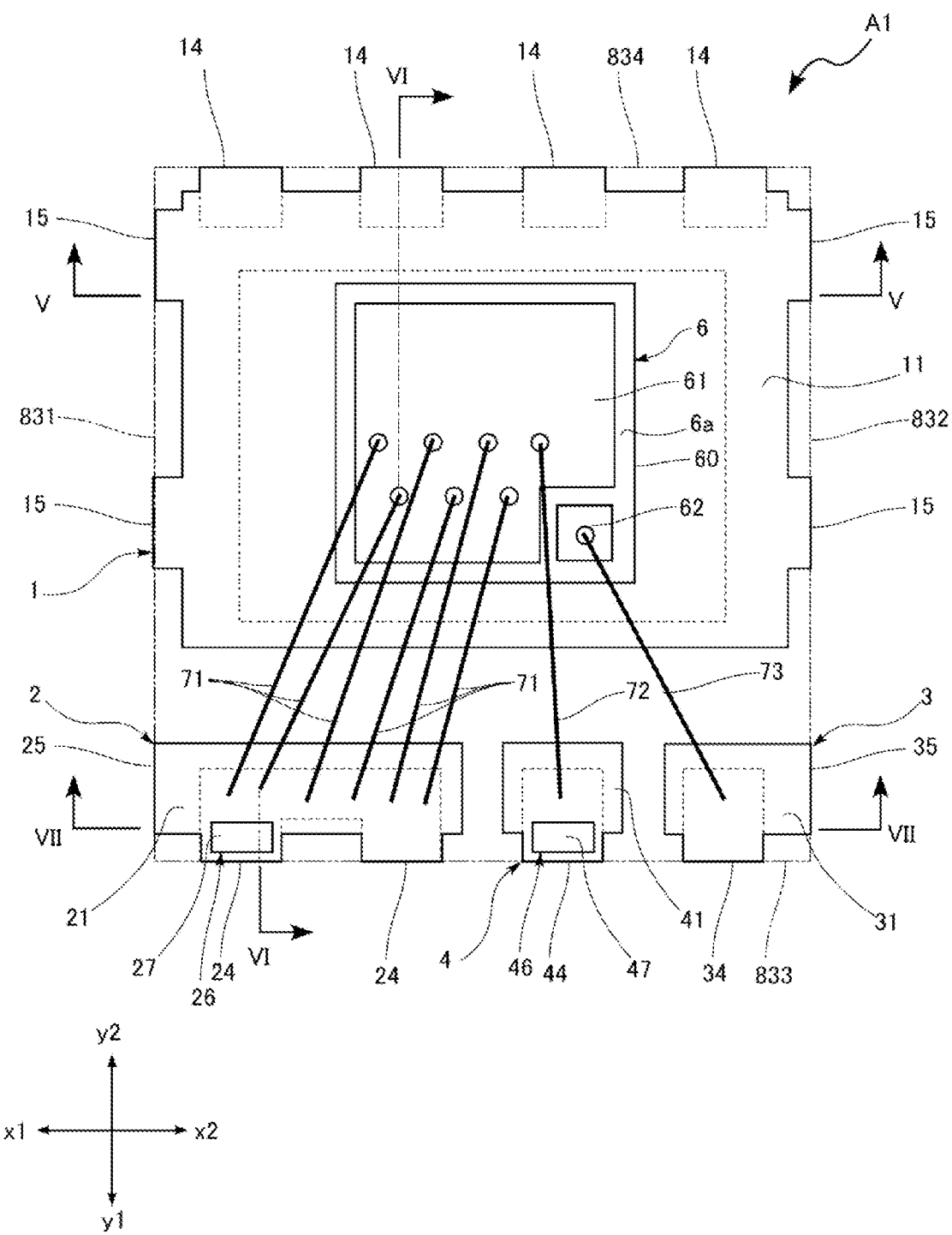
FIG. 3 is a plan view of the semiconductor device shown in FIG. 1.
Figure 4:
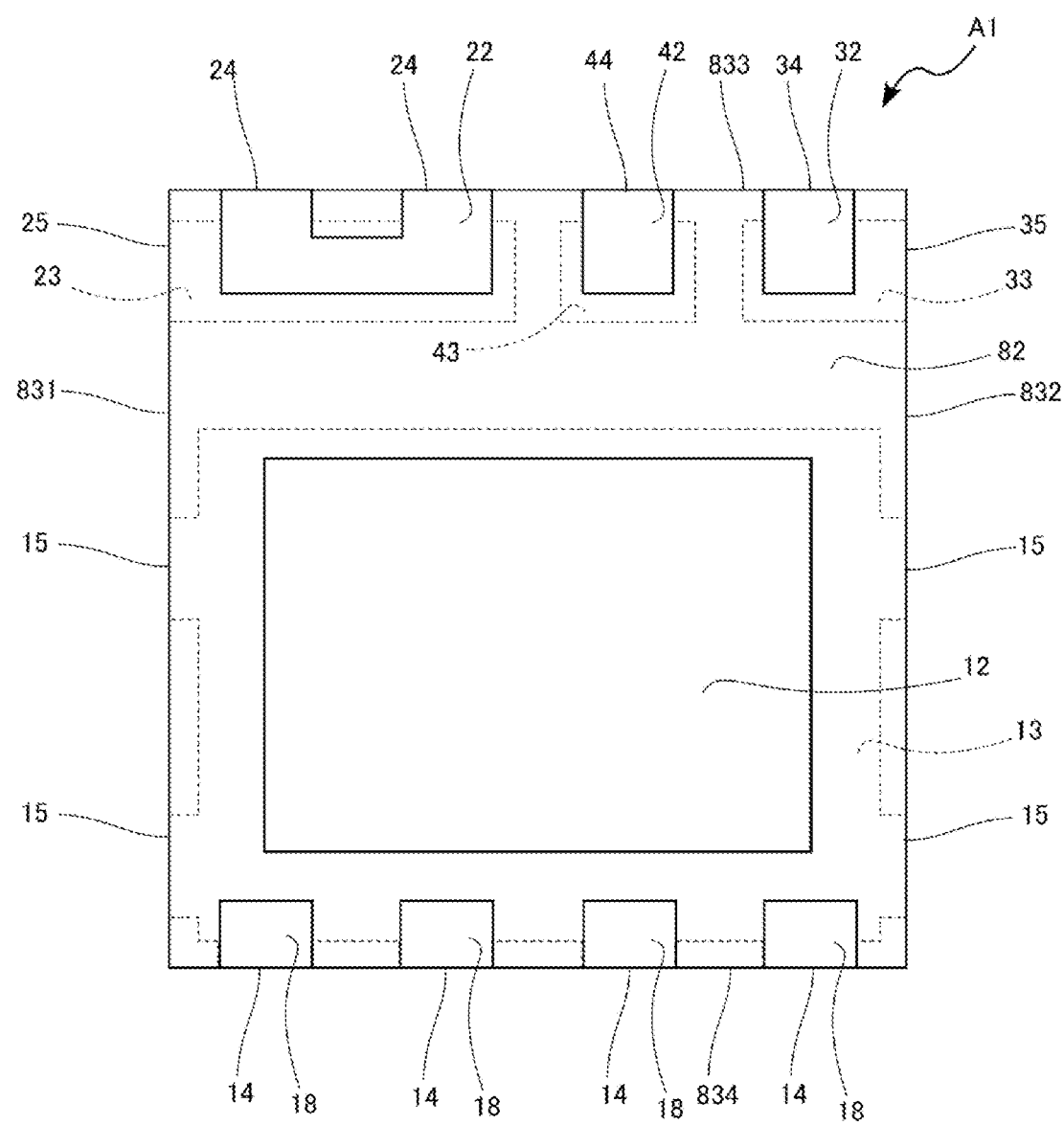
FIG. 4 is a bottom view of the semiconductor device shown in FIG. 1.
Figure 4:
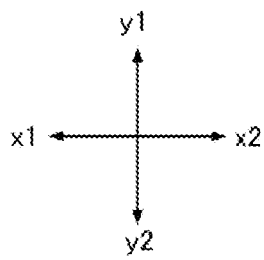
Figure 5:
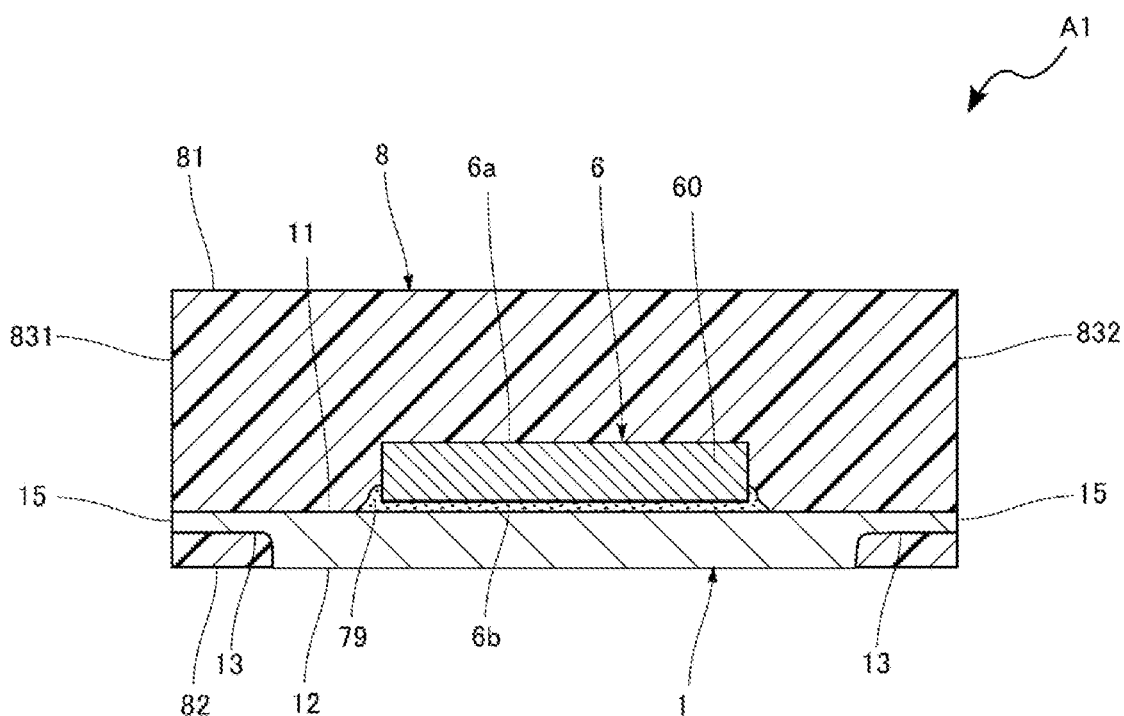
FIG. 5 is a cross-sectional view taken along line V-V in FIG. 3.
Figure 6:
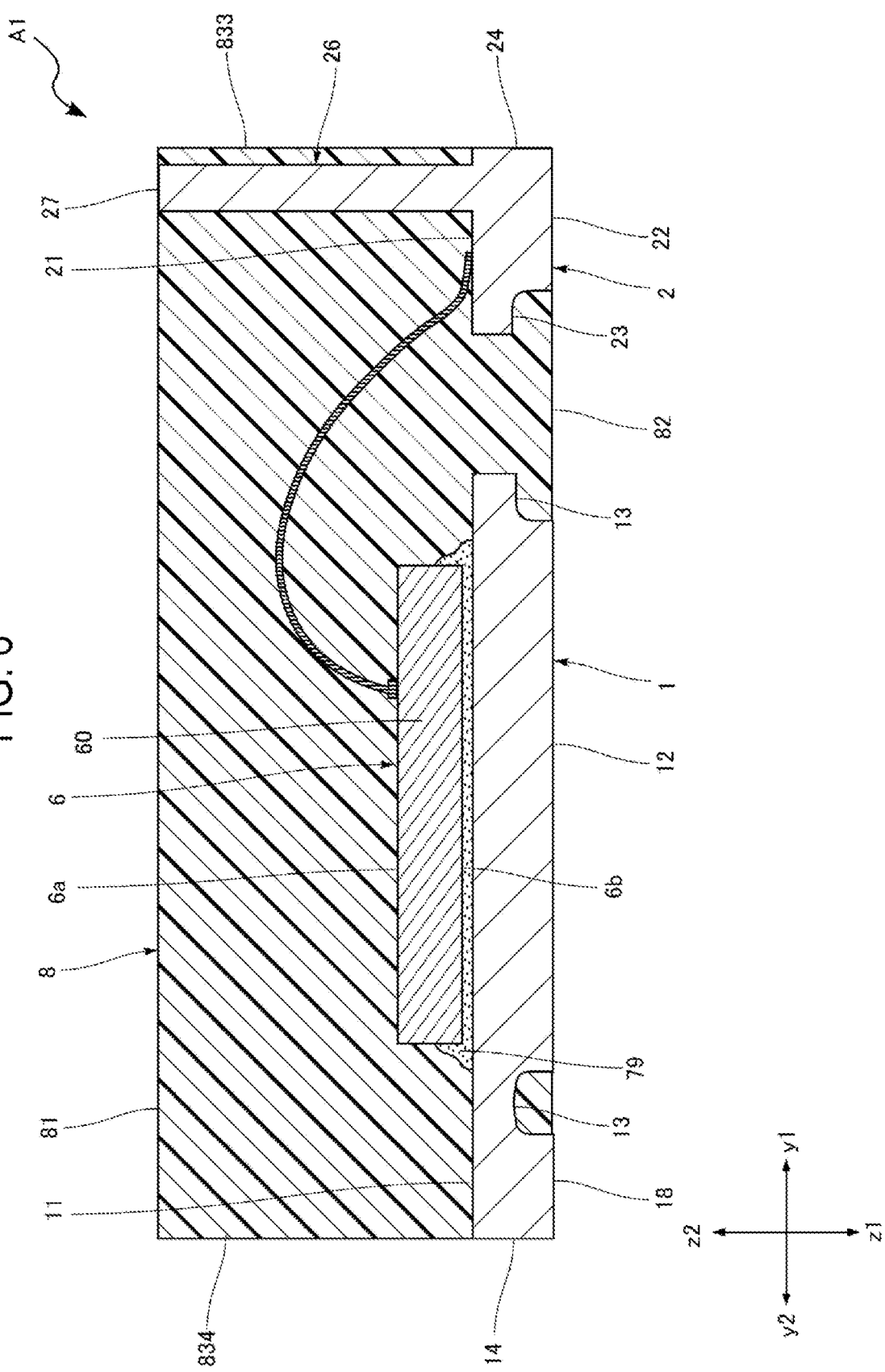
FIG. 6 is a cross-sectional view taken along line VI-VI in FIG. 3.
Figure 7:
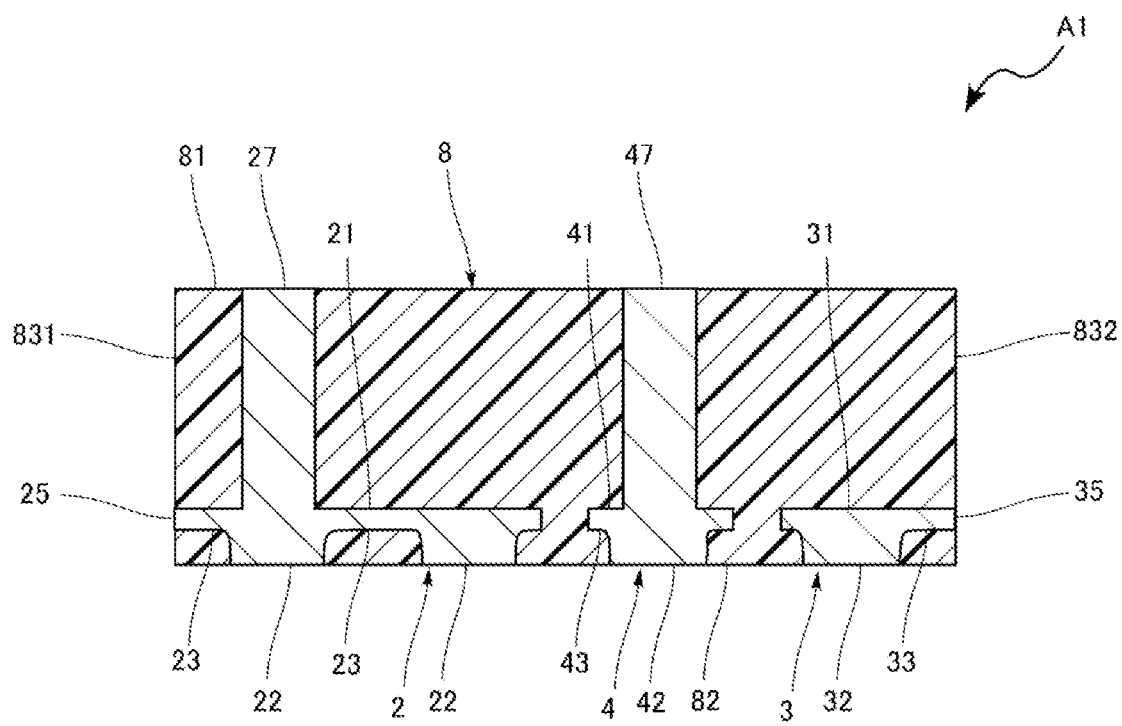
FIG. 7 is a cross-sectional view taken along line VII-VII in FIG. 3.
Figure 7:
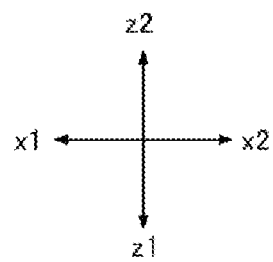

FIG. 1 is a perspective view showing the semiconductor device A1. FIG. 2 is a perspective view of the semiconductor device A1 with a bottom surface side thereof facing upward. FIG. 3 is a plan view of the semiconductor device A1. In FIG. 3, for the convenience of understanding, the sealing resin 8 is transparent and the outer shape of the sealing resin 8 is indicated by an imaginary line (two-dot chain line). FIG. 4 is a bottom view of the semiconductor device A1. FIG. 5 is a cross-sectional view taken along line V-V in FIG. 3. FIG. 6 is a cross-sectional view taken along line VI-VI in FIG. 3. FIG. 7 is a cross-sectional view taken along line VII-VII in FIG. 3.

The semiconductor device A1 shown in these figures is a device that is surface-mounted on a circuit board of various devices. The uses and functions of the semiconductor device A1 are not limited. The package format of the semiconductor device A1 is DFN (Dual Flatpack No-leaded). The package format of the semiconductor device A1 is not limited to the DFN. The shape of the semiconductor device A1 in a thickness direction is rectangular. For convenience of explanation, the thickness direction (plan view direction) of the semiconductor device A1 is defined as a z direction, a direction along one side of the semiconductor device A1 orthogonal to the z direction (a left-right direction in FIG. 3) is defined as an x direction, and a direction orthogonal to the z direction and the x direction (a vertical direction in FIG. 3) is defined as a y direction. Further, one side in the z direction (a lower side in FIGS. 5 and 6) is defined as a z1 side, and the other side (an upper side in FIGS. 5 and 6) is defined as a z2 side. One side in the x direction (a left-hand side in FIGS. 3 and 4) is defined as an x1 side, and the other side (a right-hand side in FIGS. 3 and 4) is defined as an x2 side. One side (a lower side in FIG. 3) in the y direction is defined as a y1 side, and the other side (an upper side in FIG. 3) is defined as a y2 side. The z direction corresponds to the "thickness direction" in the present disclosure. Each dimension of the semiconductor device A1 is not particularly limited. In the present embodiment, for example, the x-direction dimension is about 8 mm, the y-direction dimension is about 8 mm, and the z-direction dimension is about 1 mm.

The leads 1 to 4 are electrically connected to the semiconductor element 6. The leads 1 to 4 are formed, for example, by subjecting a metal plate to an etching process, a punching process, or the like. The leads 1 to 4 are made of metal, and in some embodiments, may be made of either Cu or Ni, or alloys thereof, 42 alloys, and the like. In the present embodiment, the case where the leads 1 to 4 are made of Cu will be described by way of example. The thickness of the leads 1 to 4 is not particularly limited, and may be, for example, 0.08 to 0.3 mm. In the present embodiment, the thickness of the leads 1 to 4 is about 0.2 mm.

As shown in FIG. 3, the lead 1 is arranged at the end of the semiconductor device A1 on the y2 side in the y direction to extend over the entire semiconductor A1 in the x direction. The leads 2 to 4 are arranged at the end of the semiconductor device A1 on the y1 side in the y direction so as to be spaced apart from the lead 1 and also spaced apart from one another in the x direction. The lead 2 is arranged at a corner portion (a lower left corner portion in FIG. 3) of the semiconductor device A1 on the x1 side in the x-direction and on the y1 side in the y-direction. The lead 3 is arranged at a corner portion (a lower right corner portion in FIG. 3) of the semiconductor device A1 on the x2 side in the x-direction and on the y1 side in the y-direction. The lead 4 is arranged between the lead 2 and the lead 3.

The lead 1 supports the semiconductor element 6 and includes a main surface 11, a back surface 12, a back surface side recess 13, a plurality of terminal back surfaces 18, a plurality of terminal end surfaces 14, and a plurality of connecting end surfaces 15.

The main surface 11 and the back surface 12 face opposite each other in the z direction. The main surface 11 faces the z2 side in the z direction. The main surface 11 is a surface on which the semiconductor element 6 is mounted. In the present embodiment, the main surface 11 has a shape having portions protruding from a rectangle elongated in the x direction toward the y2 side in the y direction and toward both sides in the x direction. There are four protruding portions on the y2 side in the y-direction, which are arranged at equal intervals in the x-direction. All four of the protruding portions reach the y2 side edge of the semiconductor device A1 in the y-direction. There are two protruding portions on the x1 side in the x-direction, which are arranged in the y-direction. Both of the two protruding portions reach the x1 side edge of the semiconductor device A1 in the x1 side. There are two protruding portions on the x2 side in the x-direction, which are arranged in the y-direction. Both of the two protruding portions reach the x2 side edge of the semiconductor device A1 in the x-direction. The back surface 12 faces the z1 side in the z direction. The back surface 12 is exposed from the sealing resin 8 and serves as a back surface terminal. In the present embodiment, the back surface 12 has a rectangular shape elongated in the x direction.

The back surface side recess 13 is a portion in which a part of the lead 1 is recessed from the back surface 12 toward the main surface 11 side. The back surface side recess 13 is arranged so as to surround the back surface 12. The thickness (z-direction dimension) of the portion of the lead 1 where the back surface side recess 13 is located is about half the thickness of the portion where the back surface 12 is located. The back surface side recess 13 is formed by, for example, a half etching process. As shown in FIG. 4, the back surface side recess 13 is not exposed from the sealing resin 8 and is covered with the sealing resin 8. As a result, the lead 1 is prevented from peeling from the sealing resin 8 toward the z1 side in the z direction.

The terminal back surfaces 18 are arranged on the y2 side of the back surface 12 in the y direction. The terminal back surfaces 18 face the z1 side in the z direction and is exposed from the sealing resin 8. The terminal back surfaces 18 are located at the same positions as the back surface 12 in the z direction and are separated from the back surface 12 by the sealing resin 8. Just like the back surface 12, the terminal back surfaces 18 are portions that remain without being etched when the back surface side recess 13 is formed by the half etching process. In the present embodiment, there are four terminal back surfaces 18 arranged at equal intervals in the x direction. All four of the terminal back surfaces 18 reach the y2 side edge of the semiconductor device A1 in the y direction.

The terminal end surfaces 14 are surfaces orthogonal to the main surface 11 and the back surface 12 and facing the y2 side in they direction. Each terminal end surface 14 is connected to any of the protruding portions of the main surface 11 on the y2 side in the y-direction and to any of the terminal back surfaces 18 and is exposed from the sealing resin 8. The terminal end surfaces 14 are formed by dicing in a cutting step of a manufacturing process. In the present embodiment, there are four terminal end surfaces 14, which are separated from one another by the sealing resin 8 and arranged at equal intervals in the x direction. Each terminal end surface 14 and the terminal back surface 18 connected thereto serve as a terminal exposed from the sealing resin 8 (see FIGS. 4 and 6).

The connecting end surfaces 15 are surfaces orthogonal to the main surface 11 and the back surface 12 and facing the x direction. Each connecting end surface 15 is connected to the main surface 11 and the back surface side recess 13 and is exposed from the sealing resin 8. The connecting end surfaces 15 are formed by dicing in a cutting step of a manufacturing process. In the present embodiment, the connecting end surfaces 15 include two connecting end surfaces 15 facing the x1 side in the x direction and two connecting end surfaces 15 facing the x2 side in the x direction. The two connecting end surfaces 15 facing the x1 side in the x-direction are separated from each other by the sealing resin 8 and are arranged side by side in the y-direction. The two connecting end surfaces 15 facing the x2 side in the x-direction are separated from each other by the sealing resin 8 and are arranged side by side in the y-direction.

The shape of the lead 1 is not limited to the above-described one. For example, the terminal end surfaces 14 and the terminal back surfaces 18 may be omitted, or the terminal back surfaces 18 may be connected to the back surface 12. In addition, the back surface side recess 13 may not be provided.

The lead 2 includes a main surface 21, a back surface 22, a back surface side recess 23, a plurality of terminal end surfaces 24, and a connecting end surface 25.

The main surface 21 and the back surface 22 face opposite each other in the z direction. The main surface 21 faces the z2 side in the z direction. The main surface 21 is a surface to which the wires 71 are bonded. In the present embodiment, the main surface 21 has a shape having portions protruding from a rectangle elongated in the x direction toward the y1 side in the y direction. There are two protruding portions, which are arranged in the x direction. Both of the two protruding portions reach the y1 side edge of the semiconductor device A1 in the y direction. The back surface 22 faces the z1 side in the z direction. The back surface 22 is exposed from the sealing resin 8 and serves as a back surface terminal. In the present embodiment, the back surface 22 has a U-shape that is opened on the y1 side in the y direction. Each end of the U-shape reaches the y1 side edge of the semiconductor device A1 in the y direction.

The back surface side recess 23 is a portion in which a part of the lead 2 is recessed from the back surface 22 to the main surface 21 side and is arranged around the back surface 22. The thickness (z-direction dimension) of the portion of the lead 2 where the back surface side recess 23 is located is about half the thickness of the portion where the back surface 22 is located. The back surface side recess 23 is formed by, for example, a half etching process. As shown in FIG. 4, the back surface side recess 23 is not exposed from the sealing resin 8 and is covered with the sealing resin 8. As a result, the lead 2 is prevented from peeling from the sealing resin 8 toward the z1 side in the z direction.

The terminal end surfaces 24 are surfaces orthogonal to the main surface 21 and the back surface 22 and facing the y1 side in the y direction. Each terminal end surface 24 is connected to any of the protruding portions of the main surface 21 and any of both ends of the U-shape of the back surface 22, and is exposed from the sealing resin 8. The terminal end surfaces 24 are formed by dicing in a cutting step of a manufacturing process. In the present embodiment, there are two terminal end surfaces 24, which are separated from each other by the sealing resin 8 and are arranged side by side in the x direction. Each terminal end surface 24 and the back surface 22 connected thereto serve as a terminal exposed from the sealing resin 8 (see FIGS. 2, 4 and 6).

The connecting end surface 25 is a surface orthogonal to the main surface 21 and the back surface 22 and facing the x1 side in the x direction. The connecting end surface 25 is connected to the main surface 21 and the back surface side recess 23 and is exposed from the sealing resin 8. The connecting end surface 25 is formed by dicing in a cutting step of a manufacturing process.

Further, the lead 2 includes a protruding portion 26. The protruding portion 26 is a portion that protrudes from the main surface 21 toward the z2 side in the z direction. The protruding portion 26 is located on the main surface 21 closer to the y1 side in they direction and closer to the x1 side in the x direction when viewed in the z direction. In the present embodiment, the protruding portion 26 is arranged on the y2 side in the y direction from the terminal end surface 24. The protruding portion 26 reaches the z2 side edge of the semiconductor device A1 in the z direction and is exposed from the sealing resin 8. The protruding portion 26 includes a top surface 27. The top surface 27 is a surface facing the z2 side in the z direction and is a surface exposed from the sealing resin 8. In the present embodiment, the protruding portion 26 has an oblong prismatic shape, and the top surface 27 has an oblong rectangular shape. In the present embodiment, the protruding portion 26 is a prism-shaped pillar made of the same material as the other portion of the lead 2, and is fixed at a predetermined position to the main surface 21 of the lead 2. The position, material, shape, and forming method of the protruding portion 26 are not limited. For example, the protruding portion 26 may be formed by performing an etching process, a bending process, or the like when forming the leads 1 to 4 from a metal plate or may be formed by plating. Further, the shape of the protruding portion 26 may be, for example, a cylindrical shape. In this case, the top surface 27 has a circular shape. The arrangement position of the protruding portion 26 may be any position as long as it does not interfere with the bonding of the wires 71.

The shape of the lead 2 is not limited to the above-described one. For example, the back surface side recess 23 may not be provided.

The lead 3 includes a main surface 31, a back surface 32, a back surface side recess 33, a terminal end surface 34, and a connecting end surface 35.

The main surface 31 and the back surface 32 face opposite each other in the z direction. The main surface 31 faces the z2 side in the z direction. The main surface 31 is a surface to which the wire 73 is bonded. In the present embodiment, the main surface 31 has a shape having a portion protruding from a rectangle elongated in the x direction toward the y1 side in the y direction. The protruding portion reaches the y1 side edge of the semiconductor device A1 in the y direction. The back surface 32 faces the z1 side in the z direction. The back surface 32 is exposed from the sealing resin 8 and serves as a back surface terminal. In the present embodiment, the back surface 32 has a rectangular shape. The back surface 32 reaches the y1 side edge of the semiconductor device A1 in they direction.

The back surface side recess 33 is a portion in which a part of the lead 3 is recessed from the back surface 32 toward the main surface 31 side. The back surface side recess 33 is arranged around the back surface 32. The thickness (z-direction dimension) of the portion of the lead 3 where the back surface side recess 33 is located is about half the thickness of the portion where the back surface 32 is located. The back surface side recess 33 is formed by, for example, a half etching process. As shown in FIG. 4, the back surface side recess 33 is not exposed from the sealing resin 8 and is covered with the sealing resin 8. As a result, the lead 3 is prevented from peeling from the sealing resin 8 toward the z1 side in the z direction.

The terminal end surface 34 is a surface orthogonal to the main surface 31 and the back surface 32 and facing the y1 side in the y direction. The terminal end surface 34 is connected to the protruding portion of the main surface 31 and the back surface 22 and is exposed from the sealing resin 8. The terminal end surface 34 is formed by dicing in a cutting step of a manufacturing process. The terminal end surface 34 and the back surface 32 serve as a terminal exposed from the sealing resin 8 (see FIGS. 2 and 4).

The connecting end surface 35 is a surface orthogonal to the main surface 31 and the back surface 32 and facing the x2 side in the x direction. The connecting end surface 35 is connected to the main surface 31 and the back surface side recess 33 and is exposed from the sealing resin 8. The connecting end surface 35 is formed by dicing in a cutting step of a manufacturing process.

The shape of the lead 3 is not limited to the above-described one. For example, the back surface side recess 33 may not be provided.

The lead 4 includes a main surface 41, a back surface 42, a back surface side recess 43, and a terminal end surface 44.

The main surface 41 and the back surface 42 face opposite each other in the z direction. The main surface 41 faces the z2 side in the z direction. The main surface 41 is a surface to which a wire 72 is bonded. In the present embodiment, the main surface 41 has a shape having a portion protruding from a rectangle toward the y1 side in they direction. The protruding portion reaches the y1 side edge of the semiconductor device A1 in they direction. The back surface 42 faces the z1 side in the z direction. The back surface 42 is exposed from the sealing resin 8 and serves as a back surface terminal. In the present embodiment, the back surface 42 has a rectangular shape. The back surface 42 reaches the y1 side edge of the semiconductor device A1 in the y direction.

The back surface side recess 43 is a portion in which a part of the lead 4 is recessed from the back surface 42 toward the main surface 41 side. The back surface side recess 43 is arranged around the back surface 42. The thickness (z-direction dimension) of the portion of the lead 4 where the back surface side recess 43 is located is about half the thickness of the portion where the back surface 42 is located. The back surface side recess 43 is formed by, for example, a half etching process. As shown in FIG. 4, the back surface side recess 43 is not exposed from the sealing resin 8 and is covered with the sealing resin 8. As a result, the lead 4 is prevented from peeling from the sealing resin 8 toward the z1 side in the z direction.

The terminal end surface 44 is a surface orthogonal to the main surface 41 and the back surface 42 and facing the y1 side in the y direction. The terminal end surface 44 is connected to the protruding portion of the main surface 41 and the back surface 42 and is exposed from the sealing resin 8. The terminal end surface 44 is formed by dicing in a cutting step of a manufacturing process. The terminal end surface 44 and the back surface 42 serve as a terminal exposed from the sealing resin 8 (see FIGS. 2 and 4).

Further, the lead 4 includes a protruding portion 46. The protruding portion 46 is a portion that protrudes from the main surface 41 toward the z2 side in the z direction. The protruding portion 46 is located on the main surface 41 closer to the y1 side in they direction when viewed in the z direction. In the present embodiment, the protruding portion 46 is arranged on the y2 side in the y direction from the terminal end surface 44. The protruding portion 46 reaches the z2 side edge of the semiconductor device A1 in the z direction and is exposed from the sealing resin 8. The protruding portion 46 includes a top surface 47. The top surface 47 is a surface facing the z2 side in the z direction and is a surface exposed from the sealing resin 8. In the present embodiment, the protruding portion 46 has an oblong prismatic shape, and the top surface 47 has an oblong rectangular shape. In the present embodiment, the protruding portion 46 is a prism-shaped pillar made of the same material as the other portion of the lead 4, and is fixed at a predetermined position of the main surface 41 of the lead 4. The position, material, shape, and forming method of the protruding portion 46 are not limited. For example, the protruding portion 46 may be formed by performing an etching process, a bending process, or the like when forming the leads 1 to 4 from a metal plate or may be formed by plating. Further, the shape of the protruding portion 46 may be, for example, a cylindrical shape. In this case, the top surface 47 has a circular shape. The arrangement position of the protruding portion 46 may be any position as long as it does not interfere with the bonding of the wire 72.

The shape of the lead 4 is not limited to the above-described one. For example, the back surface side recess 43 may not be provided.

The semiconductor element 6 is an element that exhibits electrical functions of the semiconductor device A1. The type of the semiconductor element 6 is not particularly limited. In the present embodiment, the semiconductor element 6 is a MOSFET (Metal-Oxide-Semiconductor Field-Effect Transistor). The semiconductor element 6 may be other transistors such as an IGBT (Insulated Gate Bipolar Transistor) or a HEMT (High Electron Mobility Transistor). The semiconductor element 6 includes an element body 60, an electrode 61, an electrode 62, and an electrode 63.

The element body 60 has a rectangular plate shape when viewed in the z-direction. The element body 60 is made of a semiconductor material. In the present embodiment, the element body 60 is made of Si (silicon). The material of the element body 60 is not limited and may be other materials such as SiC (silicon carbide) and GaN (gallium nitride). The element body 60 has an element main surface 6a and an element back surface 6b. The element main surface 6a and the element back surface 6b face opposite each other in the z direction. The element main surface 6a faces the z2 side in the z direction. The element back surface 6b faces the z1 side in the z direction. The electrode 61 and the electrode 62 are arranged on the element main surface 6a. The electrode 63 is arranged on the element back surface 6b. In the present embodiment, the electrode 61 is a source electrode, the electrode 62 is a gate electrode, and the electrode 63 is a drain electrode.

As shown in FIGS. 5 and 6, the semiconductor element 6 is mounted substantially at the center of the main surface 11 of the lead 1 via a bonding material 79. In the present embodiment, the bonding material 79 is a conductive bonding material, for example, solder. The bonding material 79 may be a conductive bonding material such as a silver paste or a sintered silver bonding material. In the semiconductor element 6, the element back surface 6b is bonded to the main surface 11 of the lead 1 by the bonding material 79. The electrode 63 of the semiconductor element 6 is electrically connected to the lead 1 via the bonding material 79. As a result, the lead 1 is electrically connected to the electrode 63 (drain electrode) of the semiconductor element 6 to function as a drain terminal.

As shown in FIG. 3, the electrode 62 of the semiconductor element 6 is electrically connected to the lead 3 via the wire 73. As a result, the lead 3 is electrically connected to the electrode 62 (gate electrode) of the semiconductor element 6 to function as a gate terminal. Further, as shown in FIG. 3, the electrode 61 of the semiconductor element 6 is electrically connected to the lead 2 via the wires 71. As a result, the lead 2 is electrically connected to the electrode 61 (source electrode) of the semiconductor element 6 to function as a source terminal. Further, as shown in FIG. 3, the electrode 61 of the semiconductor element 6 is electrically connected to the lead 4 via the wire 72. As a result, the lead 4 is electrically connected to the electrode 61 (source electrode) of the semiconductor element 6 to function as a sense source terminal. The sense source terminal is a terminal for detecting the potential of the electrode 61 (source electrode).

The wires 71 to 73 connect the semiconductor element 6 and the leads 2 to 4 so that they can be electrically connected to one another. The wires 71 to 73 are made of a metal such as Cu, Au, Ag, or Al. The material of the wires 71 to 73 is not limited. As shown in FIG. 3, the wires 71 are bonded to the electrode 61 of the semiconductor element 6 and the main surface 21 of the lead 2. In the present embodiment, the electrode 61 is connected to the lead 1 by six wires 71. The number of wires 71 is not limited. The wire 72 is bonded to the electrode 61 of the semiconductor element 6 and the main surface 41 of the lead 4. In the present embodiment, the electrode 61 is connected to the lead 4 by one wire 72. The number of the wires 72 is not limited. The wire 73 is bonded to the electrode 62 of the semiconductor element 6 and the main surface 31 of the lead 3. In the present embodiment, the electrode 62 is connected to the lead 3 by one wire 73. The number of the wires 73 is not limited.

The sealing resin 8 covers a part of each of the leads 1 to 4, the semiconductor element 6, the bonding material 79, and the wires 71 to 73. The sealing resin 8 is made of, for example, a black epoxy resin. The material of the sealing resin 8 is not limited.

The sealing resin 8 includes a resin main surface 81, a resin back surface 82, and four resin side surfaces 83. The resin main surface 81 and the resin back surface 82 face opposite each other in the z direction. The resin main surface 81 is a surface facing the z2 side in the z direction, and the resin back surface 82 is a surface facing the z1 side in the z direction.

The four resin side surfaces 83 are orthogonal to the resin main surface 81 and the resin back surface 82, respectively. The four resin side surfaces 83 are surfaces that connect the resin main surface 81 and the resin back surface 82, and face outward in the x direction or the y direction. Each resin side surface 83 is formed by dicing in a cutting step of a manufacturing process. The four resin side surfaces 83 include a resin side surface 831, a resin side surface 832, a resin side surface 833, and a resin side surface 834. The resin side surface 831 and the resin side surface 832 face opposite each other in the x direction. The resin side surface 831 is a surface arranged on the x1 side in the x direction and facing the x1 side in the x direction. The resin side surface 832 is a surface arranged on the x2 side in the x direction and facing the x2 side in the x direction. The resin side surface 833 and the resin side surface 834 face opposite each other in the y direction. The resin side surface 833 is a surface arranged on the y1 side in they direction and facing the y1 side in they direction. The resin side surface 834 is a surface arranged on the y2 side in the y direction and facing the y2 side in the y direction.

As shown in FIGS. 2 and 4, the back surface 12 and the terminal back surfaces 18 of the lead 1, the back surface 22 of the lead 2, the back surface 32 of the lead 3, and the back surface 42 of the lead 4 are exposed from the resin back surface 82 of the sealing resin 8, and are flush with the resin back surface 82. Further, in the present embodiment, as shown in FIGS. 1 and 6, the top surface 27 of the lead 2 and the top surface 47 of the lead 4 are exposed from the resin main surface 81 of the sealing resin 8 and are flush with the resin main surface 81. The top surface 27 and the top surface 47 may not be flush with the resin main surface 81 as long as the top surface 27 and the top surface 47 are exposed from the resin main surface 81 of the sealing resin 8. For example, the protruding portion 46 of the lead 1 and the protruding portion 46 of the lead 4 may protrude from the resin main surface 81 so that the top surface 27 and the top surface 47 may be located on the z2 side of the resin main surface 81 in the z direction. In addition, the top surface 27 and the top surface 47 may be located on the z1 side in the z direction from the resin main surface 81 and may be exposed from the recess arranged on the resin main surface 81.

Further, the two connecting end surfaces 15 of the lead 1 facing the x1 side in the x direction and the connecting end surface 25 of the lead 2 are exposed from the resin side surface 831 and are flush with the resin side surface 831. The two connecting end surfaces 15 of the lead 1 facing the x2 side in the x-direction and the connecting end surface 35 of the lead 3 are exposed from the resin side surface 832 and are flush with the resin side surface 832. The terminal end surfaces 24 of the lead 2, the terminal end surface 34 of the lead 3, and the terminal end surface 44 of the lead 4 are exposed from the resin side surface 833 and are flush with the resin side surface 833. The terminal end surfaces 14 of the lead 1 are exposed from the resin side surface 834 and are flush with the resin side surface 834.

The portion of the lead 2 exposed from the sealing resin 8 corresponds to the "second lead exposed portion" of the present disclosure and includes the back surface 22, the terminal end surfaces 24, the connecting end surface 25, and the top surface 27. The portion of the lead 3 exposed from the sealing resin 8 corresponds to the "third lead exposed portion" of the present disclosure and includes the back surface 32, the terminal end surface 34, and the connecting end surface 35. The portion of the lead 4 exposed from the sealing resin 8 corresponds to the "fourth lead exposed portion" of the present disclosure and includes the back surface 42, the terminal end surface 44, and the top surface 47. The top surface 27 of the lead 2 and the top surface 47 of the lead 4 are located on the z2 side in the z direction from the portions (the back surface 32, the terminal end surface 34, and the connecting end surface 35) of the lead 3 exposed from the sealing resin 8.

Next, an inspection method according to the present embodiment will be described below with reference to FIGS. 8 to 10B. The inspection method is a method of inspecting the bonding states of the wires 71 of the semiconductor device A1 in a state in which the semiconductor device A1 is mounted on a circuit board.

Figure 8:
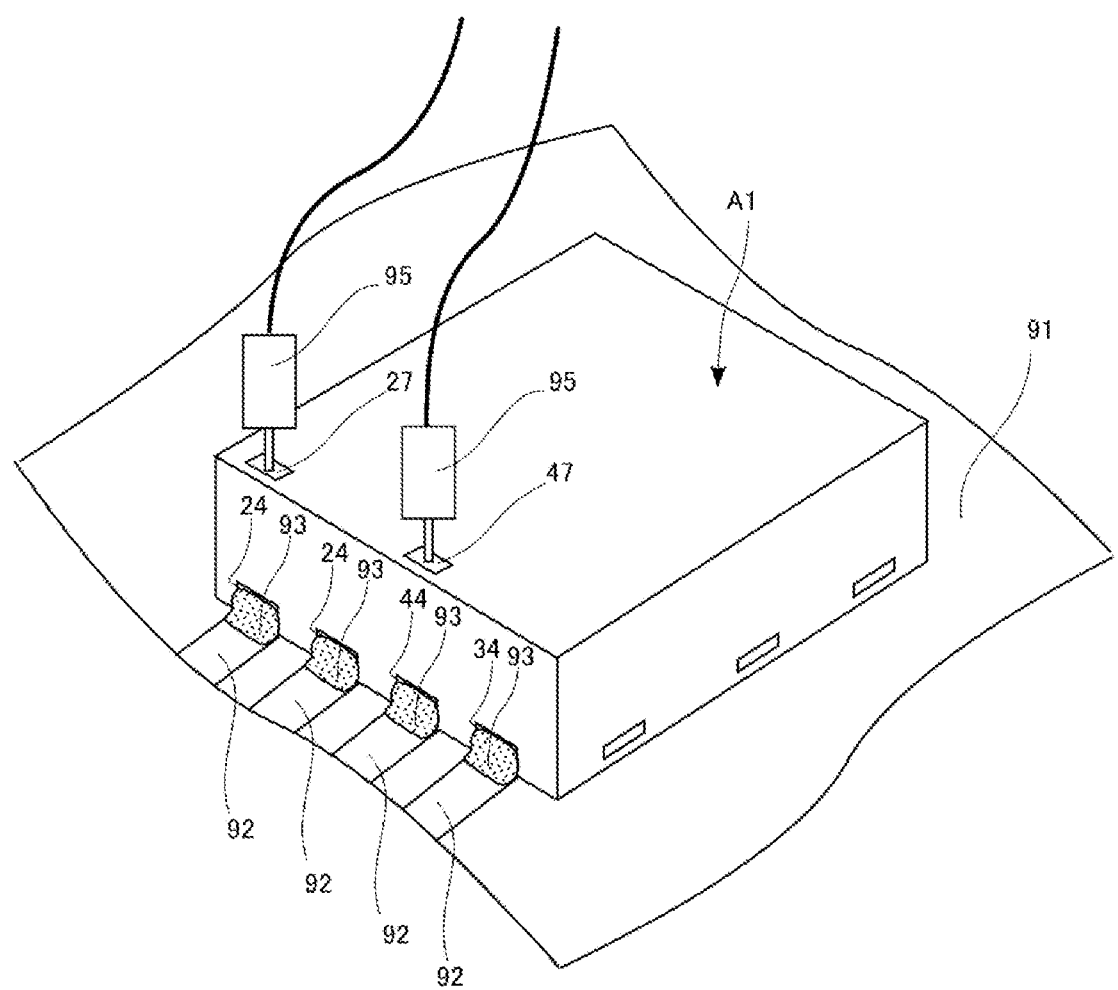
FIG. 8 is a perspective view for explaining an inspection method of the semiconductor device shown in FIG. 1, which is mounted on a circuit board.
Figure 9:
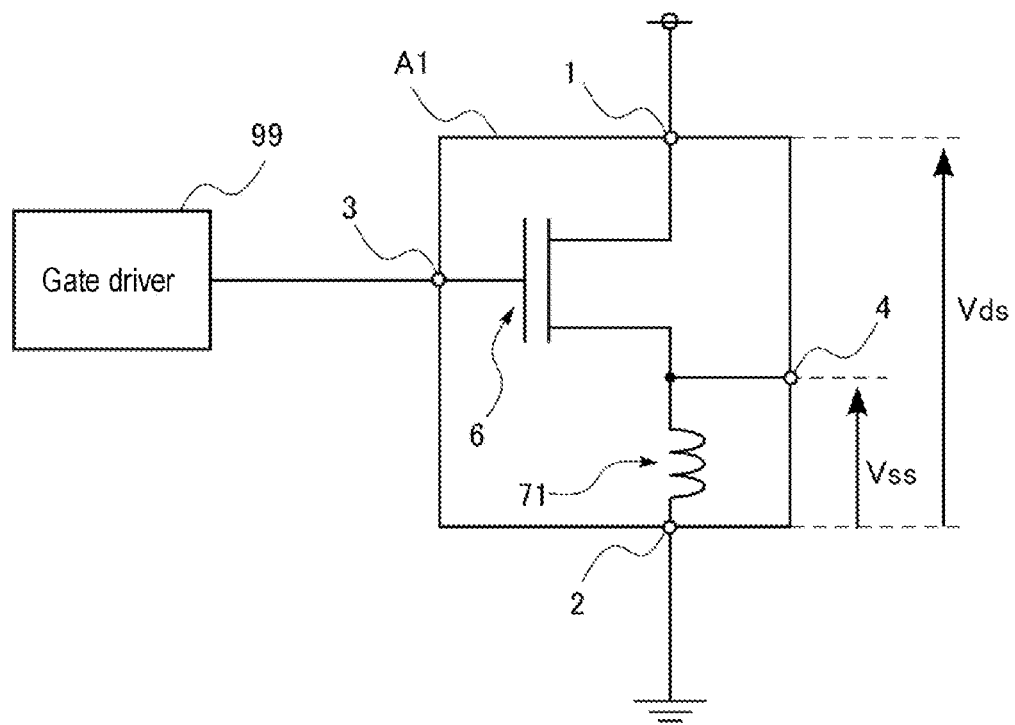
FIG. 9 is a circuit diagram showing the semiconductor device shown in FIG. 1.
Figure 10A:
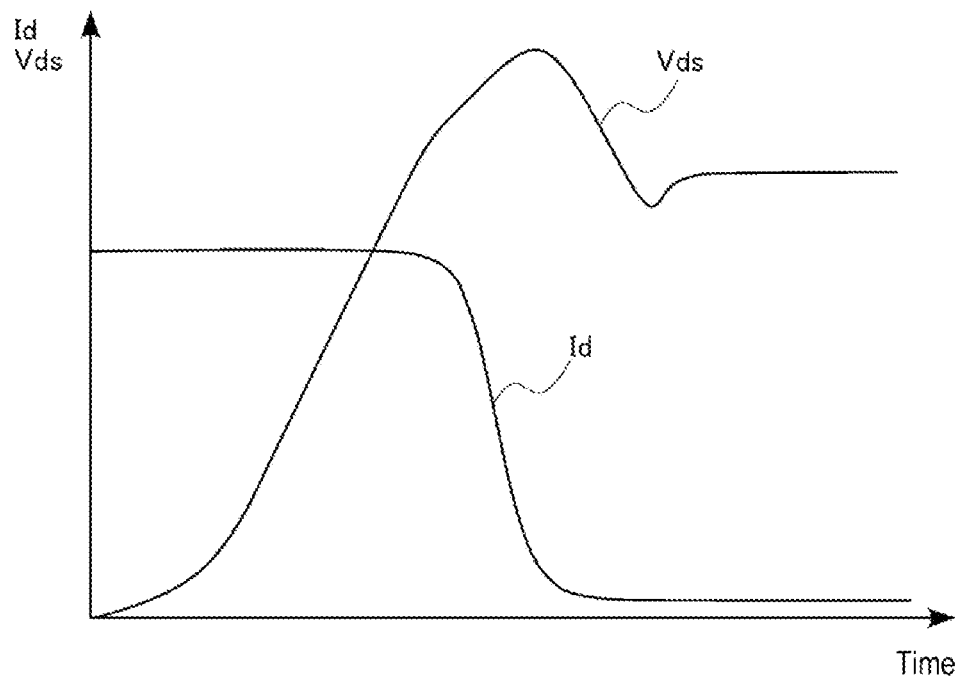
FIGS. 10A and 10B are time charts showing changes in a sense voltage at a turn-off time.
Figure 10B:
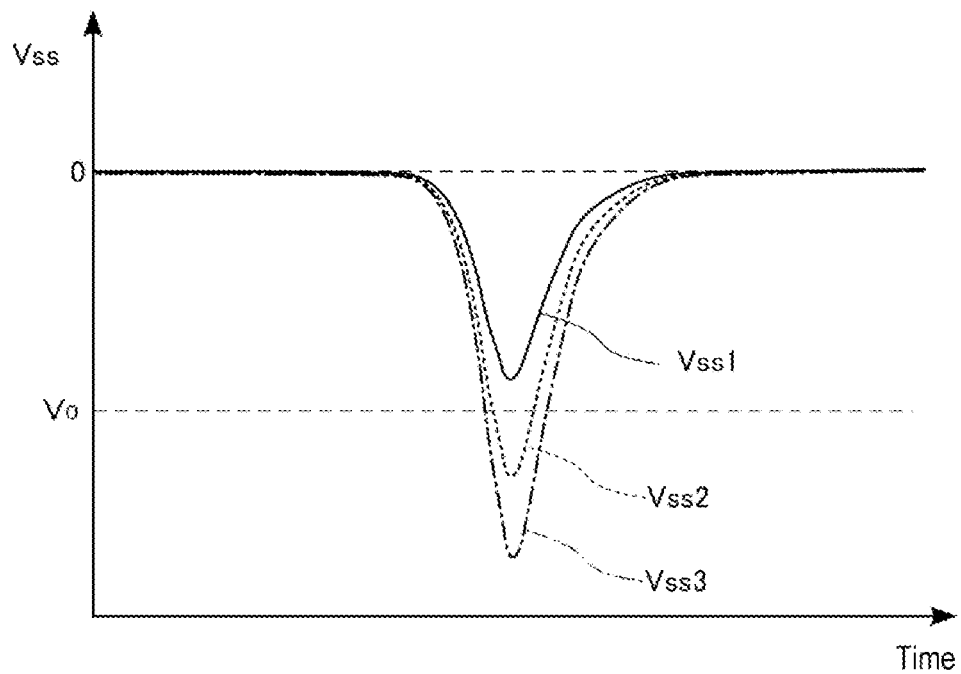

FIG. 8 is a perspective view for explaining an inspection method of the semiconductor device A1 mounted on a circuit board. FIG. 9 is a circuit diagram showing the semiconductor device A1. FIGS. 10A and 10B are time charts showing changes in a sense voltage at a turn-off time.

As shown in FIG. 8, the semiconductor device A1 is mounted on a circuit board 91. The respective terminals of the semiconductor device A1 are bonded to wirings 92 formed on the circuit board 91 by soldering. Solder fillets 93 are formed between the terminal end surfaces 24 of the lead 2 and the wirings 92, between the terminal end surface 34 of the lead 3 and the wirings 92, and between the terminal end surface 44 of the lead 4 and the wirings 92, respectively. The respective solder fillets 93 cover substantially the entirety of each terminal end surface 24, the terminal end surface 34, and the terminal end surface 44. Further, the semiconductor device A1 is connected to each electronic component mounted on the circuit board 91 via each wiring 92. As shown in FIG. 9, the lead 3 (gate terminal) is connected to an output terminal of a gate driver 99 so that a control signal (pulse signal) can be input from the gate driver 99. Further, the lead 1 (drain terminal) is electrically connected to a power supply, and a power supply voltage is applied to the lead 1. The lead 2 (source terminal) is connected to the ground. In FIG. 9, the wires 71 are indicated as an inductor.

In the inspection method according to the present embodiment, a sense voltage Vss (see FIG. 9), which is a voltage of the lead 4 (sense source terminal) with respect to the lead 2 (source terminal), is detected by two probes 95. As shown in FIG. 8, each terminal end surface 24 and the terminal end surface 44 are covered with the solder fillets 93. Therefore, it is difficult to bring each probe 95 into direct contact with each terminal end surface 24 and the terminal end surface 44. In the present embodiment, one of the two probes 95 is in contact with the top surface 27 of the lead 2, and the other is in contact with the top surface 47 of the lead 4. As a result, the sense voltage Vss can be detected with high accuracy.

In the inspection method according to the present embodiment, the control signal (pulse signal) is input from the gate driver 99 to the lead 3 (signal input process), the sense voltage Vss is detected (voltage detection process), and the connection state of the wires 71 is determined according to a peak voltage of the sense voltage Vss when the control signal (pulse signal) is turned off.

FIG. 10A shows time-dependent changes of a voltage Vds of the lead 1 with respect to the lead 2 (see FIG. 9) and a current Id flowing through the lead 1 and the lead 2. FIG. 10B shows a time-dependent change of the sense voltage Vss. At the turn-off time of the control signal (pulse signal), the voltage Vds increases and the current Id decreases. At this time, due to the decrease in the current Id, a counter electromotive force is generated between the electrode 61, to which the wires 71 as the inductor are connected, and the lead 2. As a result, as shown in FIG. 10B, the peak of the sense voltage Vss appears in the negative direction.

When any of the wires 71 bonded to the electrode 61 and the lead 2 of the semiconductor element 6 becomes an open state due to deterioration, the inductance of the wires 71 as a whole increases. Further, even if the wires 71 are not in the open state, when the connection state of the wires 71 deteriorates, the inductance becomes larger than that in the normal state. Therefore, since the counter electromotive force generated at the turn-off time becomes large, the magnitude of the peak of the sense voltage Vss becomes large. A waveform Vss1 in FIG. 10B shows a waveform of the sense voltage Vss when all six wires 71 are normally connected. A waveform Vss2 shows a waveform of the sense voltage Vss when one wire 71 is in an open state and only five wires are normally connected. A waveform Vss3 shows a waveform of the sense voltage Vss when two wires 71 are in an open state and only four wires are normally connected. In the inspection method according to the present embodiment, as shown in FIG. 10B, a voltage that is not exceeded by the sense voltage Vss when all six wires 71 are normally connected is set as a threshold voltage Vo. Then, when the sense voltage Vss at the turn-off of the control signal (pulse signal) exceeds the threshold voltage Vo (when the sense voltage Vss is equal to or lower than the threshold voltage Vo), it is determined that the bonding state of the wires 71 has deteriorated (comparison process). In contrast, when the sense voltage Vss does not exceed the threshold voltage Vo (when the sense voltage Vss is neither equal to nor lower than the threshold voltage Vo), it is determined that the bonding state of the wires 71 is normal. In the comparison process, determination may be made based on the comparison at one turn-off time, or by the comparison at several turn-off times. For example, in the comparison at five turn-off times, even when the sense voltage Vss exceeds the threshold voltage Vo once, it is determined that the bonding state of the wires 71 has deteriorated. When the sense voltage Vss does not exceed the threshold voltage Vo all five times, it is determined that the bonding state of the wires 71 is normal.

The inspection method according to the present embodiment may be executed by using an inspection device that includes an activation part for activating the gate driver 99, a detection part for detecting the sense voltage Vss, and a comparison part for comparing the detected sense voltage Vss with the threshold voltage Vo. Further, the inspection method according to the present embodiment may be manually executed by an operator. Further, the waveform of the sense voltage Vss detected in the voltage detection process may be displayed on an oscilloscope or the like, and it may be visually determined whether the displayed waveform exceeds the threshold voltage Vo. In the present embodiment, there has been described the case where the control signal is input to the semiconductor device A1 from the gate driver 99 mounted on the circuit board 91. However, the present disclosure is not limited thereto. A pulse signal may be input to the semiconductor device A1 from the outside of the circuit board 91.

Next, operative effects of the semiconductor device A1 and the inspection method will be described.

In the inspection method according to the present embodiment, the control signal (pulse signal) is input from the gate driver 99 to the lead 3, the sense voltage Vss is detected, and the bonding state of the wires 71 is determined according to the peak voltage of the sense voltage Vss at the turn-off time of the control signal (pulse signal). According to the inspection method, the determination can be made based on the change in the sense voltage Vss at the turn-off time of the control signal. Therefore, it is not necessary to supply a large current for a long time as in the case where determination is made based on a voltage change in a steady state. Accordingly, the deterioration of the wire bonding state can be detected with high accuracy without being affected by the temperature change due to the self-heating of the semiconductor device A1.

The semiconductor device A1 according to the present embodiment includes the top surface 27 of the lead 2 and the top surface 47 of the lead 4 exposed from the resin main surface 81. Therefore, even when the terminal end surface 24 of the lead 2 and the terminal end surface 44 of the lead 4 are covered with the solder fillets 93 in the state in which the semiconductor device A1 is mounted on the circuit board 91, it is possible to bring the probes 95 into contact with the top surface 27 and the top surface 47, respectively. As a result, the sense voltage Vss can be detected accurately without being affected by the solder fillets 93.

In the present embodiment, the protruding portion 26 (46) is arranged on the y2 side in the y direction from the terminal end surface 24 (44). Therefore, the side surface on the y1 side is covered with the sealing resin 8 and is not exposed from the resin side surface 833. That is, in the cutting step of the manufacturing process of the semiconductor device A1, the protruding portion 26 (46) is not located at a dicing position. This makes it easy to perform dicing.

In the present embodiment, the case of inspecting the semiconductor device A1 has been described. However, the present invention is not limited thereto. The inspection method according to the present embodiment may also be used for conventional semiconductor devices other than the semiconductor device A1, in which the top surface 27 and the top surface 47 are not exposed. When inspecting a conventional semiconductor device mounted on the circuit board 91, the sense voltage Vss may be detected by bringing each probe 95 into contact with the wiring 92 electrically connected to the lead 2 (or lead 4) or the solder fillet 93 formed on the lead 2 (or lead 4). However, in this case, the sense voltage Vss is detected in a state in which the inductance component of the wiring 92 or the solder fillet 93 is also included. The detection accuracy is lower than that in the case of bringing each probe 95 into direct contact with the lead 2 (top surface 27) and the lead 4 (top surface 47). Even in this case, the deterioration of the wire bonding state can be detected without being affected by the temperature change due to the self-heating of the semiconductor device.

Further, in the present embodiment, there has been described the case where the semiconductor element 6 and the leads 2 to 4 are connected by the wires 71 to 73, respectively. However, the present disclosure is not limited thereto. The semiconductor element 6 and the leads 2 to 4 may be connected to one another by other conductive connecting parts such as metal plates (clips) and the like.

FIGS. 11 to 18 show other embodiments of the present disclosure. In these figures, the same or similar elements as those of the above-described embodiment are designated by the same reference numerals, and duplicate descriptions thereof will be omitted.

Second Embodiment

Figure 11:
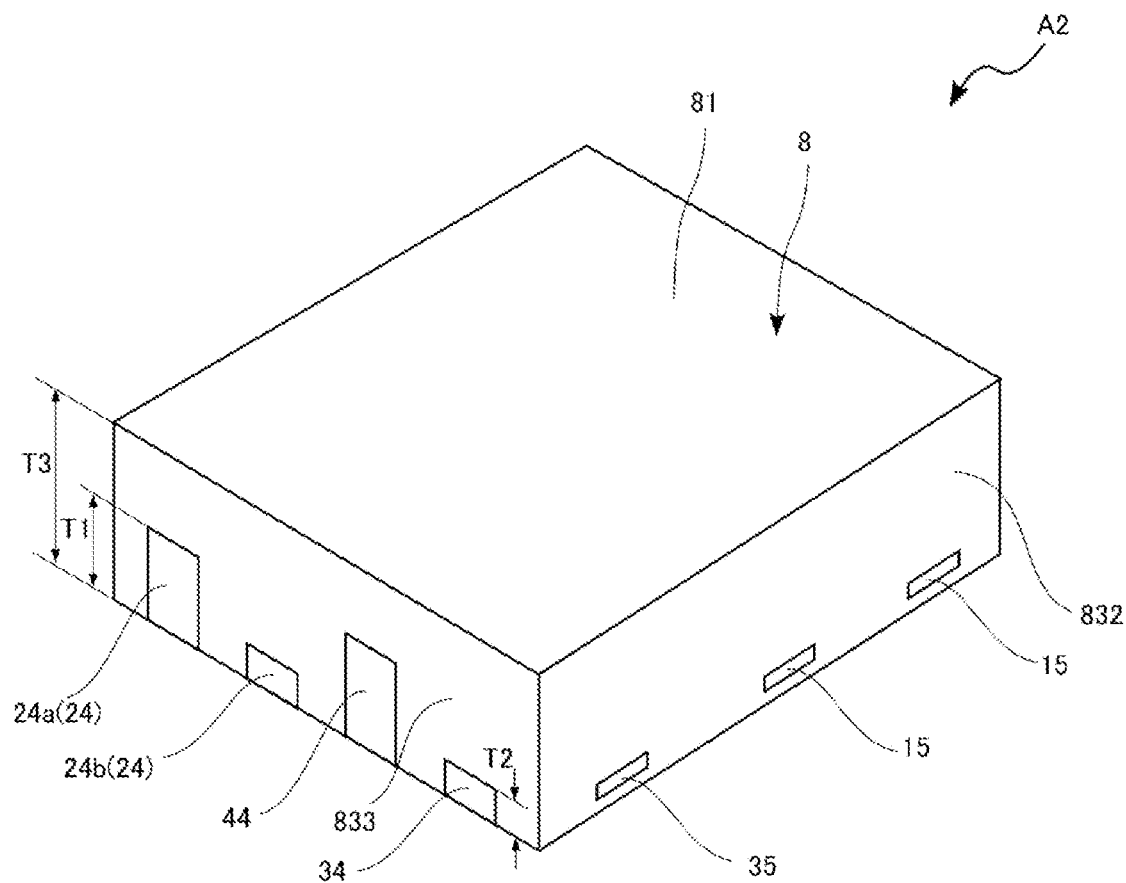
FIG. 11 is a perspective view showing a semiconductor device according to a second embodiment of the present disclosure.
Figure 11:
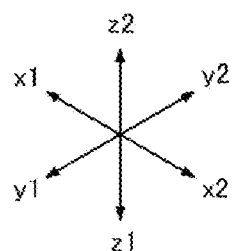
Figure 12:
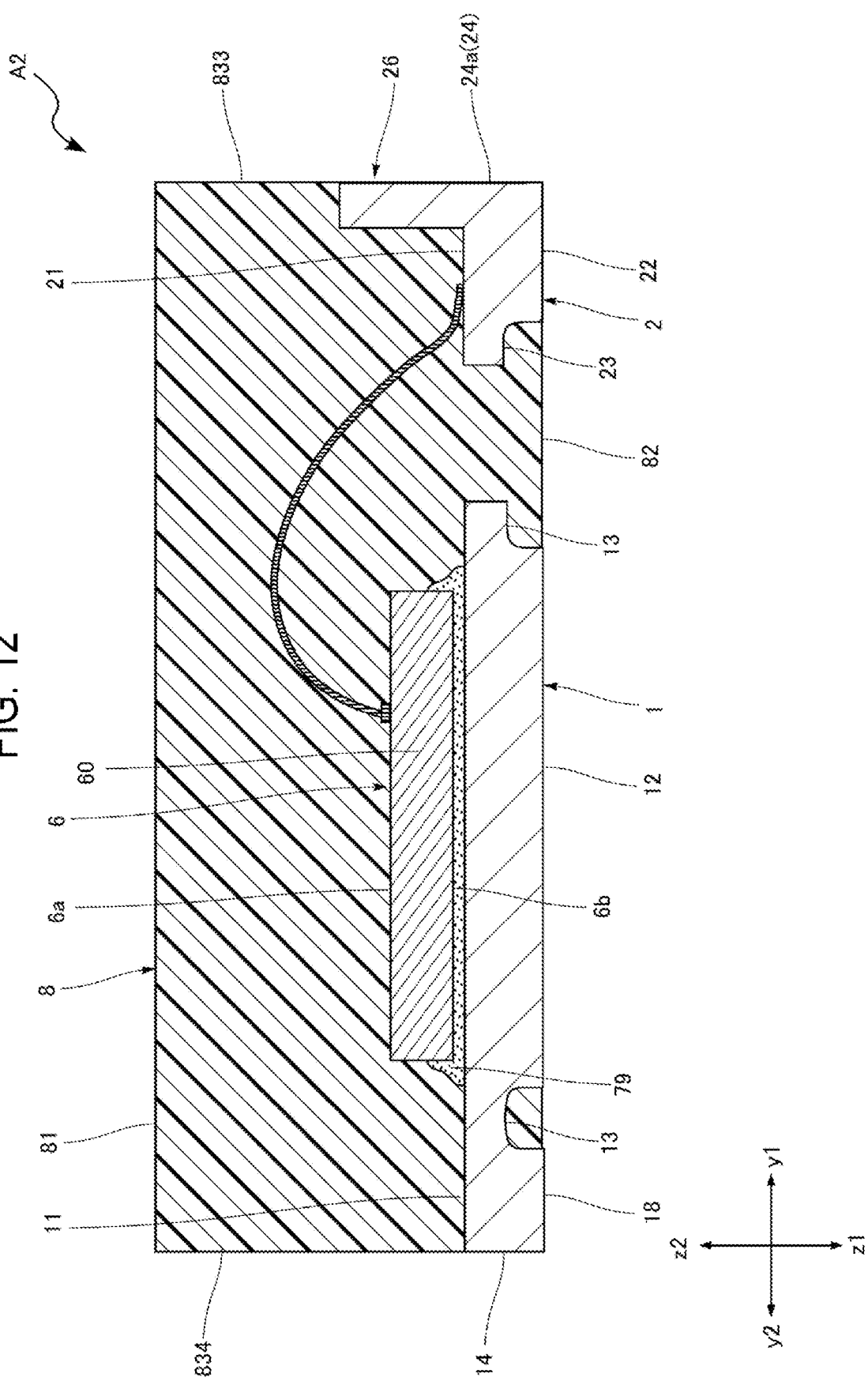
FIG. 12 is a cross-sectional view of the semiconductor device shown in FIG. 11.
Figure 13:
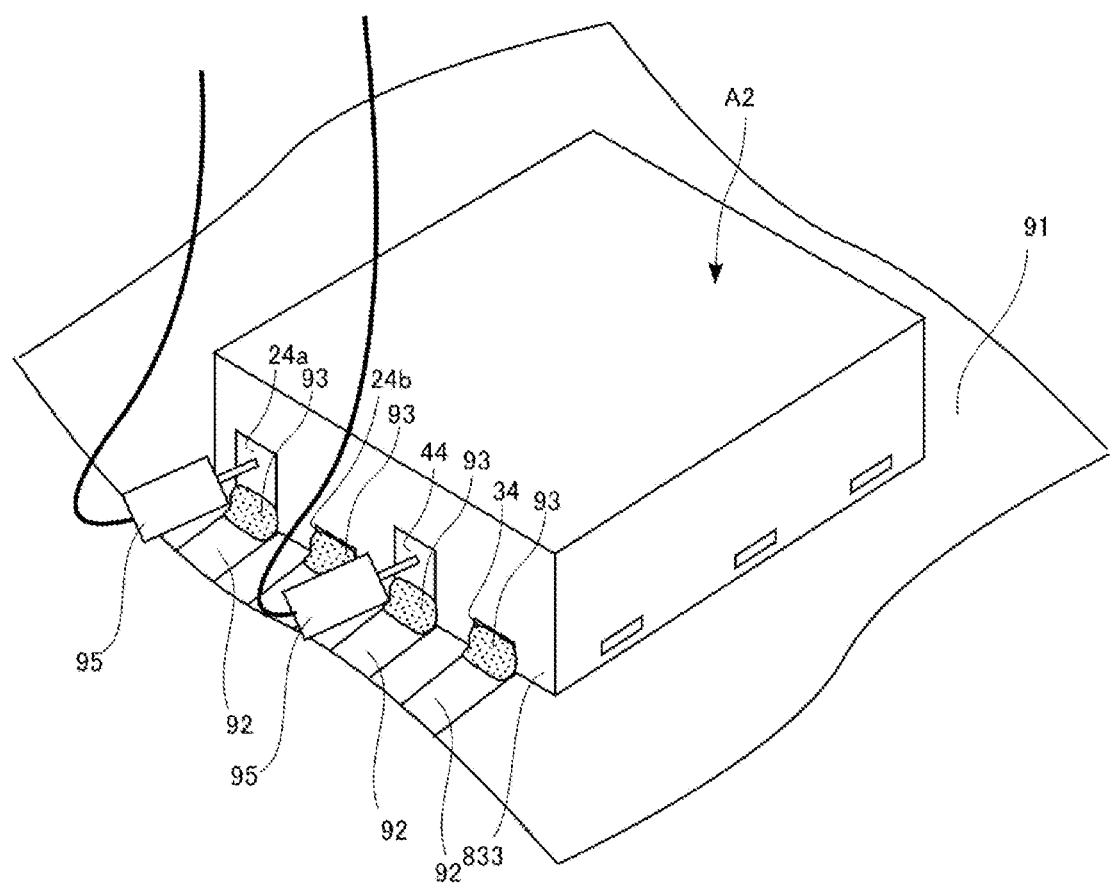
FIG. 13 is a perspective view for explaining an inspection method of the semiconductor device shown in FIG. 11, which is mounted on a circuit board.

A semiconductor device A2 according to a second embodiment of the present disclosure will be described with reference to FIGS. 11 to 13. FIG. 11 is a perspective view showing the semiconductor device A2 and is a diagram corresponding to FIG. 1. FIG. 12 is a cross-sectional view showing the semiconductor device A2 and is a diagram corresponding to FIG. 6. FIG. 13 is a perspective view for explaining an inspection method of the semiconductor device A2 mounted on the circuit board 91 and is a diagram corresponding to FIG. 8. In the semiconductor device A2 according to the present embodiment, the shapes of the leads 2 and 4 are different from those of the semiconductor device A1 according to the first embodiment.

The lead 2 according to the present embodiment is different from the lead 2 according to the first embodiment in terms of the arrangement position and the z-direction dimension of the protruding portion 26. In the present embodiment, as shown in FIG. 12, the protruding portion 26 is arranged on the y1 side in the y direction and reaches the y1 side edge of the main surface 21 in they direction. The y1 side surface of the protruding portion 26 is exposed from the resin side surface 833 and is flush with the resin side surface 833. The y1 side surface of the protruding portion 26 forms a part of the terminal end surface 24 on the x1 side. In the present embodiment, in order to distinguish between the two terminal end surfaces 24, the terminal end surface 24 on the x1 side is referred to as a terminal end surface 24*a*, and the terminal end surface 24 on the x2 side is referred to as a terminal end surface 24*b*. The protruding portion 26 according to the present embodiment is formed by fixing a pillar so as to straddle the portion of a metal plate (lead frame) forming the lead 2 and the portion to be removed by dicing, and then by dicing the metal plate in a cutting step of a manufacturing process. Further, in the present embodiment, as shown in FIG. 12, the z-direction dimension of the protruding portion 26 is smaller than that of the protruding portion 26 according to the first embodiment, and the surface of the protruding portion 26 facing the z2 side in the z direction is not exposed from the resin main surface 81. That is, the protruding portion 26 does not have the top surface 27.

The lead 4 according to the present embodiment is different from the lead 4 according to the first embodiment in terms of the arrangement position and z-direction dimension of the protruding portion 46. In the present embodiment, the protruding portion 46 is arranged on the y1 side in they direction and reaches the y1 side edge of the main surface 41 in they direction. The y1 side surface of the protruding portion 46 is exposed from the resin side surface 833 and is flush with the resin side surface 833. The y1 side surface of the protruding portion 46 forms a part of the terminal end surface 44. The protruding portion 46 according to the present embodiment is formed by fixing a pillar so as to straddle the portion of a metal plate (lead frame) forming the lead 4 and the portion to be removed by dicing, and then by dicing the metal plate in a cutting step of a manufacturing process. Further, in the present embodiment, the z-direction dimension of the protruding portion 46 is smaller than that of the protruding portion 46 according to the first embodiment, and the surface of the protruding portion 46 facing the z2 side in the z direction is not exposed from the resin main surface 81. That is, the protruding portion 26 does not have the top surface 47.

As shown in FIG. 11, the z-direction distances between the terminal end surface 24a of the lead 2 and the resin main surface 81 and between the terminal end surface 44 of the lead 4 and the resin main surface 81 are smaller than the z-direction distance between the terminal end surface 34 of the lead 3 and the resin main surface 81. In the present embodiment, a z-direction dimension T1 of the terminal end surface 24a of the lead 2 and the terminal end surface 44 of the lead 4 is twice or more of a z-direction dimension T2 of the terminal end surface 24b of the lead 2 and the terminal end surface 34 of the lead 3. Further, in the present embodiment, the dimension T1 is more than half of a z-direction dimension T3 of the resin side surface 833. The dimension T1 is not limited and may be such that even when the solder fillets 93 are formed on the terminal end surface 24a and the terminal end surface 44, exposed portions for contacting the probes 95 remain. The terminal end surface 24a of the lead 2 and the terminal end surface 44 of the lead 4 include portions located on the z2 side in the z direction from the portions (the back surface 32, the terminal end surface 34, and the connecting end surface 35) of the lead 3 exposed from the sealing resin 8. The terminal end surface 24a corresponds to the "second lead end surface" in the present disclosure. Further, the terminal end surface 44 corresponds to the "fourth lead end surface" in the present disclosure. In addition, the terminal end surface 34 corresponds to the "third lead end surface" in the present disclosure.

As shown in FIG. 13, the semiconductor device A2 is mounted on the circuit board 91. The respective terminals of the semiconductor device A2 are bonded to the wirings 92 formed on the circuit board 91 by soldering. The solder fillets 93 are formed between the terminal end surfaces 24a and 24b of the lead 2 and the respective wirings 92, between the terminal end surface 34 of the lead 3 and the wiring 92, and between the terminal end surface 44 of the lead 4 and the wiring 92. The terminal end surface 24b and the terminal end surface 34 are largely covered with the solder fillets 93, respectively. On the other hand, the terminal end surface 24a and the terminal end surface 44 are partially covered with the solder fillets 93 so that there are portions exposed from the solder fillets 93. In the inspection method according to the present embodiment, the sense voltage Vss is detected by bringing the respective probes 95 into contact with the portions exposed from the solder fillets 93.

Also in this embodiment, in the inspection method, the determination can be made based on the change in the sense voltage Vss at the turn-off time of the control signal. Therefore, it is not necessary to supply a large current for a long time as in the case of the determination made based on a voltage change in a steady state. Accordingly, the deterioration of the wire bonding state can be detected with high accuracy without being affected by the temperature change due to the self-heating of the semiconductor device A2.

Further, in the semiconductor device A2 according to the present embodiment, the terminal end surface 24a of the lead 2 and the terminal end surface 44 of the lead 4 extend toward the z2 side in the z direction and have the portions exposed from the solder fillets 93. Therefore, even when the semiconductor device A2 is mounted on the circuit board 91, the probes 95 can be brought into contact with the portions of the terminal end surface 24a and the terminal end surface 44 exposed from the solder fillets 93, respectively. As a result, the sense voltage Vss can be detected accurately without being affected by the solder fillets 93.

Third Embodiment

Figure 14:
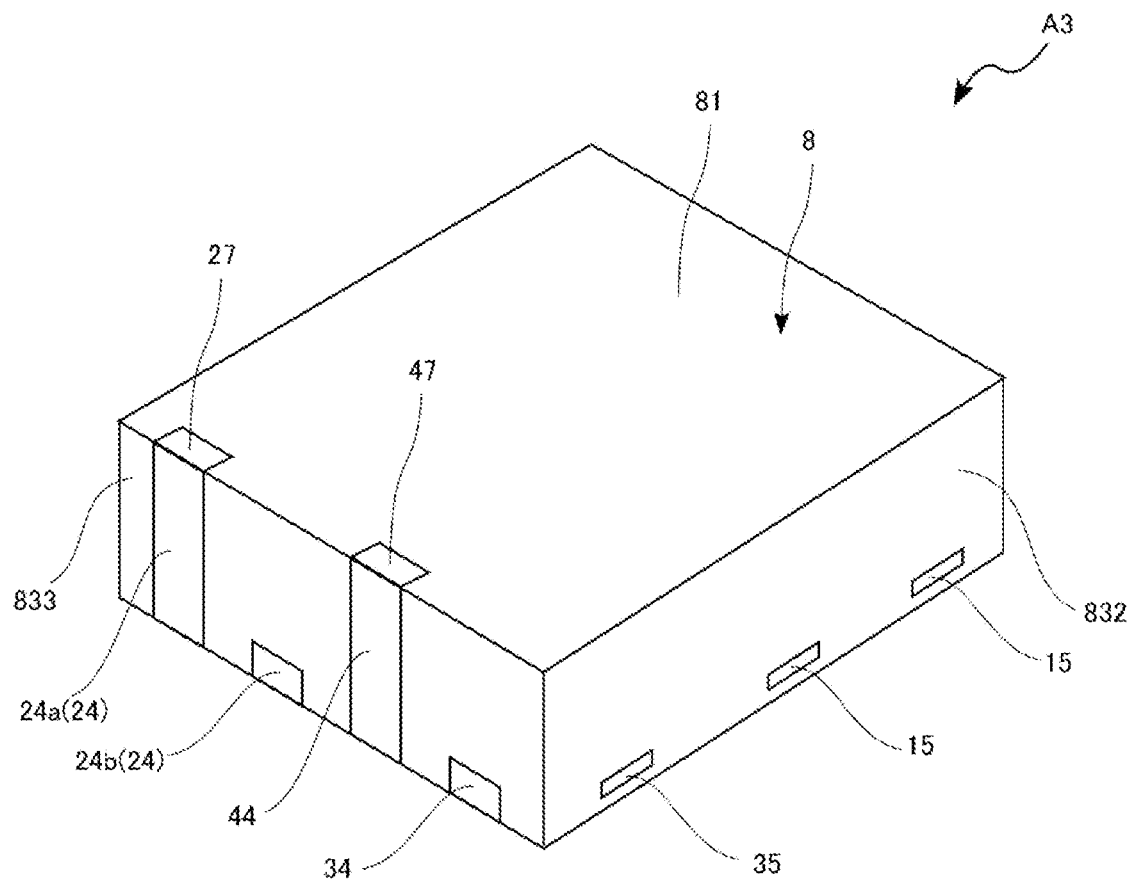
FIG. 14 is a perspective view showing a semiconductor device according to a third embodiment of the present disclosure.
Figure 14:
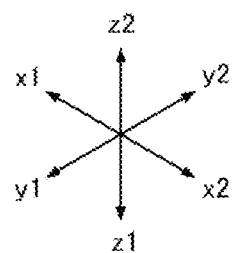
Figure 15:
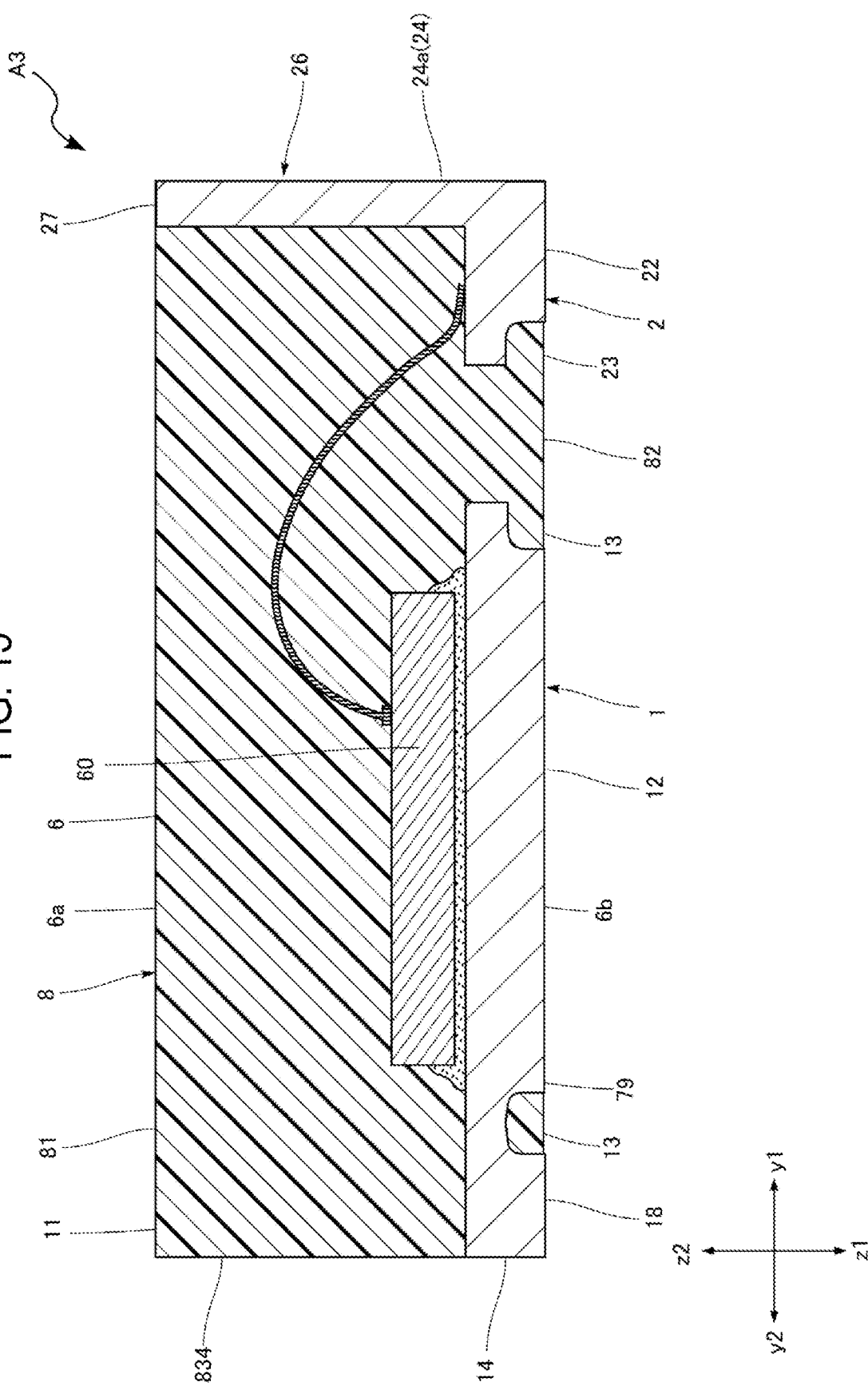
FIG. 15 is a cross-sectional view of the semiconductor device shown in FIG. 14.

A semiconductor device A3 according to a third embodiment of the present disclosure will be described with reference to FIGS. 14 and 15. FIG. 14 is a perspective view showing the semiconductor device A3 and is a diagram corresponding to FIG. 1. FIG. 15 is a cross-sectional view showing the semiconductor device A3 and is a diagram corresponding to FIG. 6. In the semiconductor device A3 according to the present embodiment, the shapes of the leads 2 and 4 are different from those of the semiconductor device A1 according to the first embodiment.

The lead 2 according to the present embodiment is different from the lead 2 according to the first embodiment in terms of the arrangement position of the protruding portion 26. In the present embodiment, as shown in FIG. 15, the protruding portion 26 is arranged on the y1 side in they direction and reaches the y1 side edge of the main surface 21 in they direction. The y1 side surface of the protruding portion 26 is exposed from the resin side surface 833 and is flush with the resin side surface 833. The y1 side surface of the protruding portion 26 forms a part of the terminal end surface 24 on the x1 side. In the present embodiment, in order to distinguish between the two terminal end surfaces 24, the terminal end surface 24 on the x1 side is referred to as the terminal end surface 24a, and the terminal end surface 24 on the x2 side is referred to as the terminal end surface 24b. The protruding portion 26 according to the present embodiment is formed by fixing a pillar so as to straddle the portion of a metal plate (lead frame) forming the lead 2 and the portion to be removed by dicing, and then by dicing the metal plate in a cutting step of a manufacturing process.

The lead 4 according to the present embodiment is different from the lead 4 according to the first embodiment in terms of the arrangement position of the protruding portion 46. In the present embodiment, the protruding portion 46 is arranged on the y1 side in they direction and reaches the y1 side edge of the main surface 41 in they direction. The y1 side surface of the protruding portion 46 is exposed from the resin side surface 833 and is flush with the resin side surface 833. The y1 side surface of the protruding portion 46 forms a part of the terminal end surface 44. The protruding portion 46 according to the present embodiment is formed by fixing a pillar so as to straddle the portion of a metal plate (lead frame) forming the lead 4 and the portion to be removed by dicing, and then by dicing the metal plate in a cutting step of a manufacturing process.

In the inspection method according to the present embodiment, the probes 95 may be brought into contact with the top surface 27 and the top surface 47, respectively, or may be brought into contact with the portions of the terminal end surface 24a and the terminal end surface 44 exposed from the solder fillets 93, respectively.

Also in this embodiment, in the inspection method, the determination can be made based on the change in the sense voltage Vss at the turn-off time of the control signal. Therefore, it is not necessary to supply a large current for a long time as in the case of the determination made based on a voltage change in a steady state. Therefore, the deterioration of the wire bonding state can be detected with high accuracy without being affected by the temperature change due to the self-heating of the semiconductor device A3.

Further, in the semiconductor device A3 according to the present embodiment, the terminal end surface 24a and the terminal end surface 44 extend toward the z2 side in the z direction and have the portions exposed from the solder fillets 93. Further, the semiconductor device A3 includes the top surface 27 and the top surface 47 exposed from the resin main surface 81. Therefore, even when the semiconductor device A2 is mounted on the circuit board 91, the probes 95 can be brought into contact with the portions of the terminal end surface 24a and the terminal end surface 44 exposed from the solder fillets 93, respectively, or can be brought into contact with the top surface 27 and the top surface 47, respectively. As a result, the sense voltage Vss can be detected accurately without being affected by the solder fillets 93.

Fourth Embodiment

Figure 16:
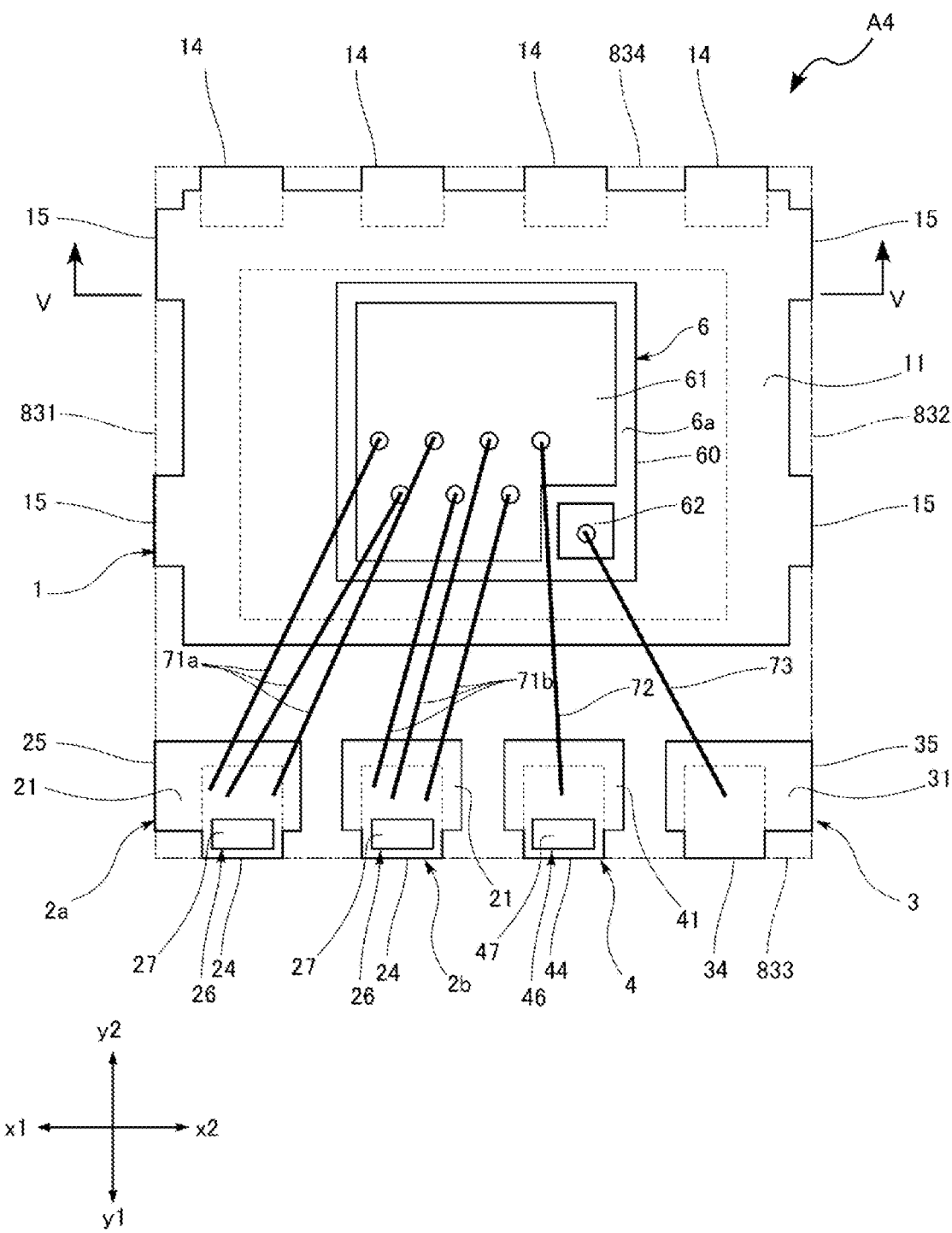
FIG. 16 is a plan view showing a semiconductor device according to a fourth embodiment of the present disclosure.

A semiconductor device A4 according to a fourth embodiment of the present disclosure will be described with reference to FIG. 16. FIG. 16 is a plan view showing the semiconductor device A4 and is a diagram corresponding to FIG. 3. In FIG. 16, for convenience of understanding, the sealing resin 8 is transparent and the outer shape of the sealing resin 8 is indicated by an imaginary line (two-dot chain line). The semiconductor device A4 according to the present embodiment is different from the semiconductor device A1 according to the first embodiment in that the lead 2 is divided into two members.

The semiconductor device A4 according to the present embodiment includes leads 2a and leads 2b, instead of the lead 2. The lead 2a and the lead 2b are obtained by dividing the lead 2 into two members in the x direction. The lead 2a is arranged on the x1 side in the x direction and the lead 2b is arranged on the x2 side in the x direction. Each of the lead 2a and the lead 2b includes the main surface 21, the back surface 22, the back surface side recess 23, and the terminal end surface 24. The lead 2a further includes the connecting end surface 25. Further, each of the lead 2a and the lead 2b has the protruding portion 26. The protruding portion 26 is the same as the protruding portion 26 according to the first embodiment and has the top surface 27.

In the present embodiment, among the plurality of wires 71, wires bonded to the lead 2a are referred to as wires 71a, and wires bonded to the lead 2b are referred to as wires 71b. In this embodiment, there are three wires 71a and three wires 71b.

Hereinafter, the inspection method of determining the bonding state of the plurality of wires 71 according to the peak voltage of the sense voltage Vss at the turn-off time of the control signal (pulse signal) described in the first embodiment is referred to as a "first inspection method." According to the present embodiment, in the first inspection method, by bringing the probes 95 into contact with the top surface 27 of the lead 2a and the top surface 47 of the lead 4, respectively, the bonding state of the plurality of wires 71a can be inspected. Further, by bringing the probes 95 into contact with the top surface 27 of the lead 2b and the top surface 47 of the lead 4, respectively, the bonding state of the plurality of wires 71b can be inspected. Further, according to the present embodiment, a second inspection method can be performed by bringing the probes 95 into contact with the top surface 27 of the lead 2a and the top surface 27 of the lead 2b, respectively. In the second inspection method, a resistance value of a current flow path composed of the lead 2a, the wires 71a, the electrode 61, the wires 71b, and the lead 2b is detected by applying a voltage between the two probes 95 and detecting a current flowing therethrough. When any one of the plurality of wires 71a and the plurality of wires 71b deteriorates, the resistance value of the current flow path increases. As a result, the deterioration of the bonding state of the plurality of wires 71a and the plurality of wires 71b can be detected while the semiconductor device A4 is mounted on the circuit board 91.

In this embodiment, the lead 2a or the lead 2b may be deemed to correspond to a "second lead" in the present disclosure. Further, it may be considered that one of the lead 2a and the lead 2b corresponds to a "second lead" in the present disclosure, and the other corresponds to a "fourth lead" in the present disclosure.

Also in the present embodiment, in the first inspection method, the determination can be made based on the change in the sense voltage Vss at the turn-off time of the control signal. Therefore, it is not necessary to supply a large current for a long time as in the case of the determination made based on a voltage change in a steady state. Therefore, the deterioration of the wire bonding state can be detected with high accuracy without being affected by the temperature change due to the self-heating of the semiconductor device A4. Further, in the second inspection method, the current flowing for the inspection may be small, and it is not necessary to supply a large current for a long time as in the case of the determination made based on a voltage change in a steady state. Therefore, the deterioration of the wire bonding state can be detected with high accuracy without being affected by the temperature change due to the self-heating of the semiconductor device A4.

Further, the semiconductor device A4 according to the present embodiment includes the top surface 27 of the lead 2a, the top surface 27 of the lead 2b, and the top surface 47 of the lead 4 exposed from the resin main surface 81. Therefore, even when the terminal end surface 24 of the lead 2a, the terminal end surface 24 of the lead 2b, and the terminal end surface 44 of the lead 4 are covered with the solder fillets 93 in a state in which the semiconductor device A4 is mounted on the circuit board 91, the probes 95 can be brought into contact with the top surfaces 27 and 47, respectively. Therefore, in the first inspection method, the sense voltage Vss can be detected accurately without being affected by the solder fillets 93. Further, also in the second inspection method, the resistance value of the current flow path can be accurately detected without being affected by the solder fillets 93. Moreover, in the present embodiment, the protruding portion 26 (46) is arranged on the y2 side in the y direction from the terminal end surface 24 (44). Therefore, in the cutting step of the manufacturing process of the semiconductor device A4, the protruding portion 26 (46) is not located at a dicing position. This makes it easy to perform dicing.

Fifth Embodiment

Figure 17:
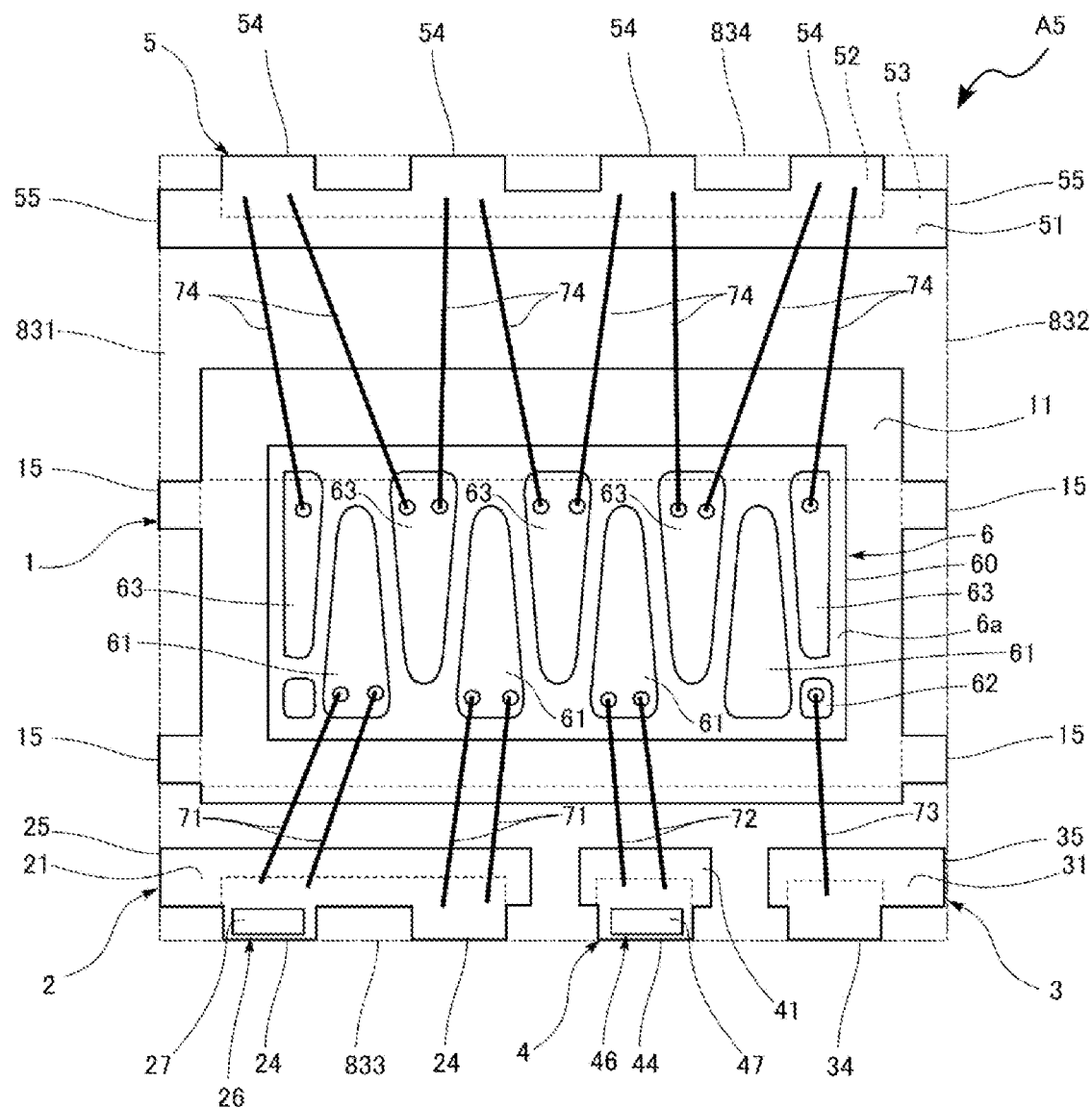
FIG. 17 is a plan view showing a semiconductor device according to a fifth embodiment of the present disclosure.
Figure 17:
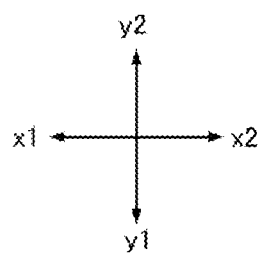

A semiconductor device A5 according to a fifth embodiment of the present disclosure will be described with reference to FIG. 17. FIG. 17 is a plan view showing the semiconductor device A5 and is a diagram corresponding to FIG. 3. In FIG. 17, for convenience of understanding, the sealing resin 8 is transparent and the outer shape of the sealing resin 8 is indicated by an imaginary line (two-dot chain line). The semiconductor device A5 according to the present embodiment is different from the semiconductor device A1 according to the first embodiment in that the semiconductor element 6 is of a different type and a lead 5 is provided.

The lead 1 according to the present embodiment does not have the terminal end surface 14 and the terminal back surface 18. In the semiconductor device A5, the lead 1 is arranged closer to the y1 side than the center in the y direction. The semiconductor device A5 according to the present embodiment further includes the lead 5. The lead 5 is spaced apart from the lead 1 and is arranged at the y2 side end of the semiconductor device A5 in the y direction. The lead 5 extends over the entire semiconductor device A5 in the x direction. The lead 5 includes a main surface 51, a back surface 52, a back surface side recess 53, a plurality of terminal end surfaces 54, and a plurality of connecting end surfaces 55.

The main surface 51 and the back surface 52 face opposite each other in the z direction. The main surface 51 faces the z2 side in the z direction. The main surface 51 is a surface to which wires 74 are bonded. The wires 74 are the same as the wires 71 to 73. In the present embodiment, the main surface 51 has a shape having portions protruding from a rectangle elongated in the x direction toward the y2 side in the y direction. There are four protruding portions, which are arranged in the x direction. All four of the protruding portions reach the y2 side edge of the semiconductor device A5 in the y direction. The back surface 52 faces the z1 side in the z direction. The back surface 52 is exposed from the sealing resin 8 and serves as a back surface terminal. In the present embodiment, the back surface 52 has a shape having a portion protruding from a rectangle elongated in the x direction toward the y2 side in the y direction. There are four protruding portions, which are arranged in the x direction. All the protruding portions reach the y2 side edge of the semiconductor device A5 in the y direction.

The back surface side recess 53 is a portion in which a part of the lead 5 is recessed from the back surface 52 toward the main surface 51 side. The back surface side recess 53 is arranged around the back surface 52. The thickness (z-direction dimension) of the portion of the lead 5 where the back surface side recess 53 is located is about half the thickness of the portion where the back surface 52 is located. The back surface side recess 53 is formed by, for example, a half etching process. The back surface side recess 53 is not exposed from the sealing resin 8 and is covered with the sealing resin 8. As a result, the load 5 is prevented from peeling from the sealing resin 8 toward the z1 side in the z direction.

The terminal end surfaces 54 are surfaces orthogonal to the main surface 51 and the back surface 52 and facing the y2 side in the y direction. Each terminal end surface 54 is connected to any of the protruding portions of the main surface 51 and any of the protruding portions of the back surface 52 and is exposed from the sealing resin 8. The terminal end surface 54 is formed by dicing in a cutting step of a manufacturing process. In the present embodiment, there are four terminal end surfaces 54, which are separated by the sealing resin 8 and arranged at equal intervals in the x direction. Each terminal end surface 54 and the back surface 52 connected thereto serve as a terminal exposed from the sealing resin 8.

The connecting end surfaces 55 are surfaces orthogonal to the main surface 51 and the back surface 52 and facing the x direction. Each connecting end surface 55 is connected to the main surface 51 and the back surface side recess 53 and is exposed from the sealing resin 8. In the present embodiment, one connecting end surface 55 is arranged on the x1 side and the other connecting end surface 55 is arranged on the x2 side in the x direction. The connecting end surface 55 is formed by dicing in a cutting step of a manufacturing process. The shape of the lead 5 is not limited to the above-described one. For example, the back surface side recess 53 may not be provided.

The semiconductor element 6 according to the present embodiment is a semiconductor element using a nitride semiconductor and is a HEMT using gallium nitride (GaN). The element body 60 is formed by stacking, for example, a buffer layer, a GaN layer constituting an electron traveling layer, an AlGaN layer constituting an electron supply layer, a p-type GaN layer, and a protective film made of, for example, a SiN film, on a Si substrate. A two-dimensional electron gas (2DEG: 2-Dimensional Electron Gas) generated at a position near the interface between the GaN layer and the AlGaN layer is used for a current flow path. In the semiconductor element 6 according to the present embodiment, the electrode 61, the electrode 62, and the electrode 63 are arranged on the element main surface 6a. In the present embodiment, the electrode 61, the electrode 62, and the electrode 63 are arranged separately at a plurality of portions. The layout of the arrangement of the electrode 61, the electrode 62, and the electrode 63 is not limited. In the present embodiment, the electrode 61 is a source electrode, the electrode 62 is a gate electrode, and the electrode 63 is a drain electrode.

The electrode 62 is electrically connected to the lead 3 via the wire 73. As a result, the lead 3 is electrically connected to the electrode 62 (gate electrode) and functions as a gate terminal. Further, the electrode 61 of the semiconductor element 6 is electrically connected to the lead 2 via the wires 71. As a result, the lead 2 is electrically connected to the electrode 61 (source electrode) of the semiconductor element 6 and functions as a source terminal. Further, the electrode 61 of the semiconductor element 6 is electrically connected to the lead 4 via the wires 72. As a result, the lead 4 is electrically connected to the electrode 61 (source electrode) of the semiconductor element 6 and functions as a sense source terminal. Further, the electrode 63 is electrically connected to the lead 5 via the wires 74. As a result, the lead 5 is electrically connected to the electrode 63 (drain electrode) and functions as a drain terminal.

Also in the present embodiment, in the first inspection method, the determination can be made based on the change in the sense voltage Vss at the turn-off time of the control signal. Therefore, it is not necessary to supply a large current for a long time as in the case of the determination made based on a voltage change in a steady state. Therefore, the deterioration of the wire bonding state can be detected with high accuracy without being affected by the temperature change due to the self-heating of the semiconductor device A5.

Further, also in the present embodiment, the semiconductor device A5 includes the top surface 27 and the top surface 47 exposed from the resin main surface 81. Therefore, even when the terminal end surface 24 of the lead 2 and the terminal end surface 44 of the lead 4 are covered with the solder fillets 93 in the state in which the semiconductor device A5 is mounted on the circuit board 91, the probes 95 can be brought into contact with the top surface 27 and the top surface 27, respectively. As a result, the sense voltage Vss can be detected accurately without being affected by the solder fillets 93. Further, in the present embodiment, the protruding portion 26 (46) is arranged on the y2 side in the y direction from the terminal end surface 24 (44). Therefore, in the cutting step of the manufacturing process of the semiconductor device A5, the protruding portion 26 (46) is not located at a dicing position. This makes it easy to perform dicing.

Sixth Embodiment

Figure 18:
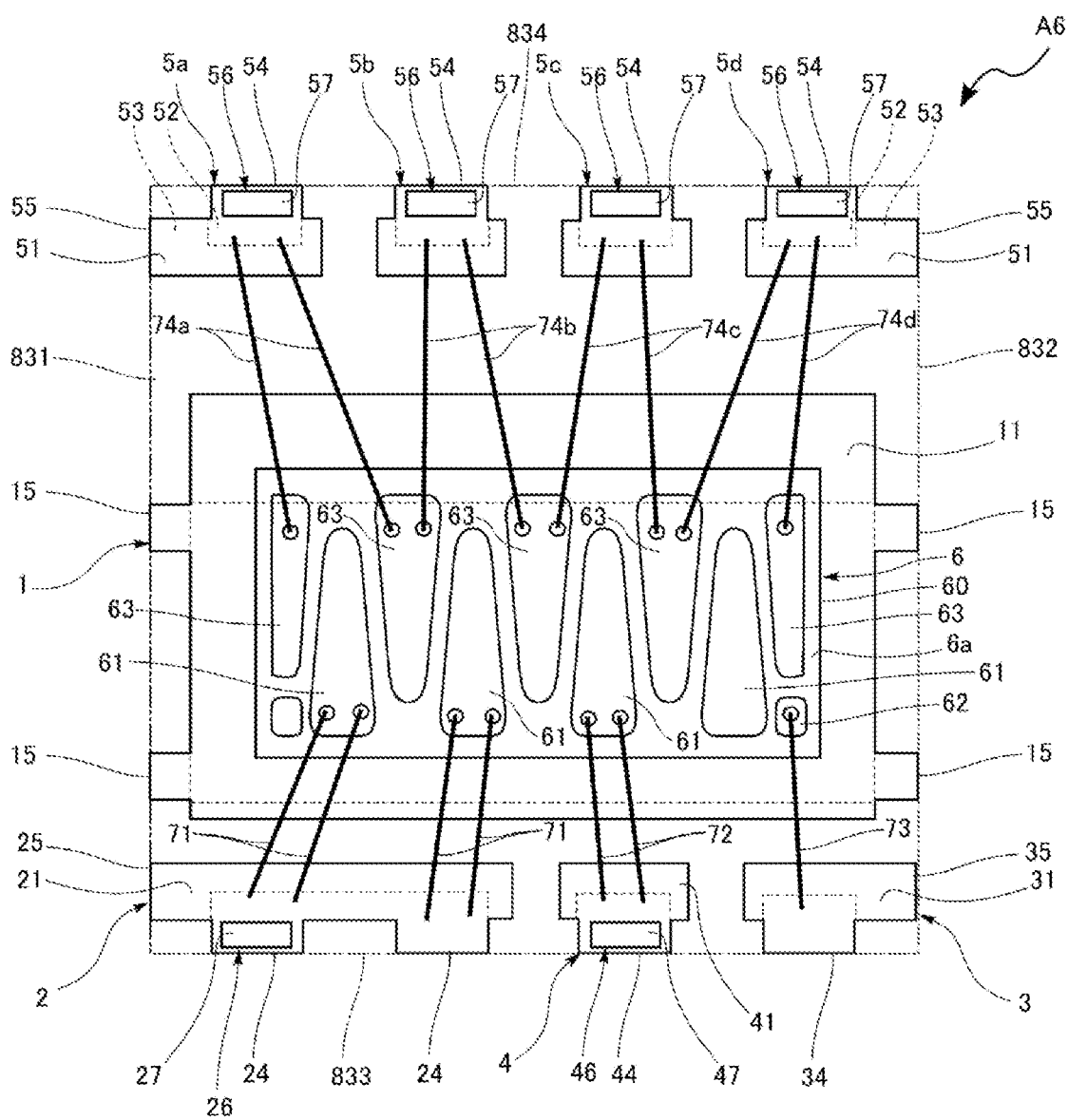
FIG. 18 is a plan view showing a semiconductor device according to a sixth embodiment of the present disclosure.

A semiconductor device A6 according to a sixth embodiment of the present disclosure will be described with reference to FIG. 18. FIG. 18 is a plan view showing the semiconductor device A6 and is a diagram corresponding to FIG. 3. In FIG. 18, for convenience of understanding, the sealing resin 8 is transparent and the outer shape of the sealing resin 8 is indicated by an imaginary line (two-dot chain line). The semiconductor device A6 according to the present embodiment is different from the semiconductor device A5 according to the fifth embodiment in that the lead 5 is divided into four members.

The semiconductor device A6 according to the present embodiment includes a lead 5a, a lead 5b, a lead 5c, and a lead 5d in place of the lead 5. The lead 5a, the lead 5b, the lead 5c, and the lead 5d are obtained by dividing the lead 5 into four members in the x direction and are arranged in the named order from the x1 side to the x2 side in the x direction. Each of the lead 5a, the lead 5b, the lead 5c, and the lead 5d includes the main surface 51, the back surface 52, the back surface side recess 53, and the terminal end surface 54. Each of the leads 5a and 5d further includes the connecting end surface 55. Further, each of the lead 5a, the lead 5b, the lead 5c, and the lead 5d has a protruding portion 56.

The protruding portion 56 is a portion that protrudes from the main surface 51 toward the z2 side in the z direction. The protruding portion 56 is located closer to the y2 side of the main surface 51 in the y direction when viewed in the z direction. In the present embodiment, the protruding portion 56 is arranged on the y1 side in the y direction from the terminal end surface 54. The protruding portion 56 reaches the z2 side edge of the semiconductor device A6 in the z direction and is exposed from the sealing resin 8. The protruding portion 56 includes a top surface 57. The top surface 57 is a surface facing the z2 side in the z direction and is a surface exposed from the sealing resin 8. In the present embodiment, the protruding portion 56 has an oblong prismatic shape and the top surface 57 has an oblong rectangular shape. The position, material, shape, and forming method of the protruding portion 56 are not limited. The arrangement position of the protruding portion 56 may be any position as long as it does not interfere with the bonding of the wires 74.

In the present embodiment, among the plurality of wires 74, wires bonded to the lead 5a are referred to as wires 74a, wires bonded to the lead 5b are referred to as wires 74b, wires bonded to the lead 5c are referred to as wires 74c, and wires bonded to the lead 5d are referred to as wires 74d. In this embodiment, two wires 74a, two wires 74b, two wires 74c, and two wires to 74d are provided.

In the present embodiment, the deterioration of the bonding state of the wires 74a to 74d can be detected by the second inspection method. By performing the second inspection method by bringing the probes 95 into contact with the top surface 57 of the lead 5a and the top surface 57 of the lead 5b, respectively, it is possible to detect the deterioration of the bonding state of the plurality of wires 74a and the plurality of wires 74b. Similarly, by performing the second inspection method by bringing the probes 95 into contact with the top surface 57 of the lead 5c and the top surface 57 of the lead 5d, respectively, it is possible to detect the deterioration of the bonding state of the plurality of wires 74c and the plurality of wires 74d.

In the present embodiment, it may also be considered that any one of the lead 5a, the lead 5b, the lead 5c, and the lead 5d corresponds to the "second lead" in the present disclosure, and another one corresponds to the "fourth lead" in the present disclosure. In this case, the electrode 63 corresponds to the "first electrode" in the present disclosure.

Also in the present embodiment, in the first inspection method, the determination can be made based on the change in the sense voltage Vss at the turn-off time of the control signal. Therefore, it is not necessary to supply a large current for a long time as in the case of the determination made based on a voltage change in a steady state. Therefore, the deterioration of the wire bonding state can be detected with high accuracy without being affected by the temperature change due to the self-heating of the semiconductor device A6. Further, in the second inspection method, the current flowing for the inspection may be small, and it is not necessary to supply a large current for a long time as in the case of the determination made based on a voltage change in a steady state. Therefore, the deterioration of the wire bonding state can be detected with high accuracy without being affected by the temperature change due to the self-heating of the semiconductor device A6.

Further, the semiconductor device A6 according to the present embodiment includes the top surface 27 of the lead 2, the top surface 47 of the lead 4, the top surface 57 of the lead 5a, the top surface 57 of the lead 5b, the top surface 57 of the lead 5c, and the top surface 57 of the lead 5d, which are exposed from the resin main surface 81. Therefore, even when the terminal end surface 24 of the lead 2 and the terminal end surface 44 of the lead 4 are covered with the solder fillet 93 in the state in which the semiconductor device A6 is mounted on the circuit board 91, the probes 95 can be brought into contact with the top surface 27 and the top surface 47, respectively. Thus, in the first inspection method, the sense voltage Vss can be detected accurately without being affected by the solder fillets 93. Further, even when the terminal end surface 54 of the lead 5a, the terminal end surface 54 of the lead 5b, the terminal end surface 54 of the lead 5c, and the terminal end surface 54 of the lead 5d are covered with the solder fillets 93, the probes 95 can be brought into contact with the top surfaces 57, respectively. As a result, in the second inspection method, the resistance value of the current flow path can be accurately detected without being affected by the solder fillets 93. Moreover, in the present embodiment, the protruding portion 26 (46) is arranged on the y2 side in the y direction from the terminal end surface 24 (44). Therefore, in the cutting step of the manufacturing process of the semiconductor device A6, the protruding portion 26 (46) is not located at a dicing position. In addition, each protruding portion 56 is arranged on the y1 side in they direction from a corresponding one of the terminal end surfaces 54. Therefore, in the cutting step of the manufacturing process of the semiconductor device A6, each protruding portion 56 is not located at a dicing position. This makes it easy to perform dicing.

The semiconductor device and the inspection method according to the present disclosure are not limited to the above-described embodiments. The specific configuration of each component of the semiconductor device according to the present disclosure and the specific processing in each process of the inspection method of the present disclosure may be variously redesigned.

[Supplementary Note 1]

A semiconductor device, including:

a semiconductor element having an element main surface and an element back surface facing opposite each other in a thickness direction, and first and second electrodes arranged on the element main surface;

a first lead on which the semiconductor element is mounted;

a second lead arranged to be spaced apart from the first lead and electrically connected to the first electrode;

a third lead arranged to be spaced apart from the first lead and the second lead and electrically connected to the second electrode;

a plurality of first connecting portions bonded to the first electrode and the second lead; and a sealing resin configured to cover the semiconductor element, wherein the sealing resin includes a resin main surface facing the same side as the element main surface, a resin back surface facing the same side as the element back surface, and a resin side surface connected to the resin main surface and the resin back surface, wherein the second lead includes a second lead exposed portion exposed from the sealing resin, wherein the third lead includes a third lead exposed portion exposed from the sealing resin, and wherein the second lead exposed portion includes a portion located on a side of the resin main surface with respect to the third lead exposed portion.

[Supplementary Note 2]

The semiconductor device of Supplementary Note 1, further including a fourth lead arranged to be spaced apart from the first to third leads and electrically connected to the first electrode, wherein the fourth lead includes a fourth lead exposed portion exposed from the sealing resin, and wherein the fourth lead exposed portion includes a portion located on a side of the resin main surface with respect to the third lead exposed portion.

[Supplementary Note 3]

The semiconductor device of Supplementary Note 2, wherein the second lead exposed portion includes a second lead top surface exposed from the resin main surface, and wherein the fourth lead exposed portion includes a fourth lead top surface exposed from the resin main surface.

[Supplementary Note 4]

The semiconductor device of Supplementary Note 2 or 3, wherein the second lead exposed portion includes a second lead end surface exposed from the resin side surface, wherein the third lead exposed portion includes a third lead end surface exposed from the resin side surface, wherein the fourth lead exposed portion includes a fourth lead end surface exposed from the resin side surface, and wherein distances between the second lead end surface and the resin main surface and between the fourth lead end surface and the resin main surface in the thickness direction are smaller than a distance between the third lead end surface and the resin main surface in the thickness direction.

[Supplementary Note 5]

The semiconductor device of Supplementary Note 4, wherein dimensions of the second lead end surface and the fourth lead end surface in the thickness direction are twice or more of a dimension of the third lead end surface in the thickness direction.

[Supplementary Note 6]

The semiconductor device of Supplementary Note 4, wherein dimensions of the second lead end surface and the fourth lead end surface in the thickness direction are more than half of a dimension of the resin side surface in the thickness direction.

[Supplementary Note 7]

The semiconductor device of any one of Supplementary Notes 2 to 6, wherein the second lead exposed portion includes a second lead back surface exposed from the resin back surface, wherein the third lead exposed portion includes a third lead back surface exposed from the resin back surface, and wherein the fourth lead exposed portion includes a fourth lead back surface exposed from the resin back surface.

[Supplementary Note 8]

The semiconductor device of any one of Supplementary Notes 2 to 7, further including a plurality of second connecting portions bonded to the first electrode and the fourth lead.

[Supplementary Note 9]

The semiconductor device of Supplementary Note 8, wherein the plurality of first connecting portions and the plurality of second connecting portions are wires.

[Supplementary Note 10]

The semiconductor device of any one of Supplementary Notes 2 to 9, wherein the semiconductor element is a transistor, and wherein the second electrode is a gate electrode.

[Supplementary Note 11]

The semiconductor device of Supplementary Note 10, wherein the semiconductor element further includes an electron traveling layer made of a nitride semiconductor.

[Supplementary Note 12]

The semiconductor device of Supplementary Note 10 or 11, wherein the first electrode is a source electrode.

[Supplementary Note 13]

The semiconductor device of Supplementary Note 10 or 11, wherein the first electrode is a drain electrode.

[Supplementary Note 14]

An inspection method of inspecting a bonding state of the plurality of first connecting portions of the semiconductor device of any one of Supplementary Notes 2 to 12 in a state in which the semiconductor device is mounted on a circuit board, the inspection method including:

a signal input process of inputting a pulse signal to the third lead;

a voltage detection process of detecting a sense voltage which is a voltage of the fourth lead with respect to the second lead; and a comparison process of comparing the sense voltage at a turn-off time of the pulse signal with a threshold voltage.

[Supplementary Note 15]

The inspection method of Supplementary Note 14, wherein the voltage detection process includes bringing two probes for detecting the sense voltage into contact with the second lead exposed portion and the fourth lead exposed portion, respectively.

[Supplementary Note 16]

An inspection method of inspecting a bonding state of a plurality of first connecting portions bonded to a source terminal of a semiconductor device, which includes a gate terminal, the source terminal, and a sense source terminal, in a state in which the semiconductor device is mounted on a circuit board, the inspection method including:

a signal input process of inputting a pulse signal to the gate terminal;

a voltage detection process of detecting a sense voltage which is a voltage of the sense source terminal with respect to the source terminal; and a comparison process of comparing the sense voltage at a turn-off time of the pulse signal with a threshold voltage.

[Supplementary Note 17]

The inspection method of any one of Supplementary Notes 14 to 16, wherein the comparison process includes determining that the bonding state has deteriorated when the sense voltage becomes equal to or less than the threshold voltage.

According to the present disclosure in some embodiments, it is possible to provide an inspection method capable of detecting deterioration of a wire bonding state with high accuracy in a state in which a semiconductor device is mounted on a circuit board, and a semiconductor device appropriate for the inspection method.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
    a semiconductor element having an element main surface and an element back surface facing opposite each other in a thickness direction, and first and second electrodes arranged on the element main surface;
    a first lead on which the semiconductor element is mounted;
    a second lead arranged to be spaced apart from the first lead and electrically connected to the first electrode;
    a third lead arranged to be spaced apart from the first lead and the second lead and electrically connected to the second electrode;
    a plurality of first connecting portions bonded to the first electrode and the second lead; and
    a sealing resin configured to cover the semiconductor element,
        wherein the sealing resin includes a resin main surface facing the same side as the element main surface, a resin back surface facing the same side as the element back surface, and a resin side surface connected to the resin main surface and the resin back surface,
    wherein the second lead includes a second lead exposed portion exposed from the sealing resin,
    wherein the third lead includes a third lead exposed portion exposed from the sealing resin,
    wherein the second lead exposed portion includes a portion located on the resin main surface with respect to the third lead exposed portion, and
    wherein the third lead exposed portion includes a back surface and a terminal end surface while a main surface of the third lead is covered with the sealing resin in the thickness direction.

2. The semiconductor device of claim 1, further comprising:
    a fourth lead arranged to be spaced apart from the first to third leads and electrically connected to the first electrode,
    wherein the fourth lead includes a fourth lead exposed portion exposed from the sealing resin, and
    wherein the fourth lead exposed portion includes a portion located on the resin main surface with respect to the third lead exposed portion.

3. The semiconductor device of claim 2,
    wherein the second lead exposed portion includes a second lead top surface exposed from the resin main surface, and
    wherein the fourth lead exposed portion includes a fourth lead top surface exposed from the resin main surface.

4. The semiconductor device of claim 2,
    wherein the second lead exposed portion includes a second lead end surface exposed from the resin side surface,
    wherein the third lead exposed portion includes a third lead end surface exposed from the resin side surface,
    wherein the fourth lead exposed portion includes a fourth lead end surface exposed from the resin side surface, and
    wherein distances between the second lead end surface and the resin main surface and between the fourth lead end surface and the resin main surface in the thickness direction are smaller than a distance between the third lead end surface and the resin main surface in the thickness direction.

5. The semiconductor device of claim 4, wherein dimensions of the second lead end surface and the fourth lead end surface in the thickness direction are twice or more of a dimension of the third lead end surface in the thickness direction.

6. The semiconductor device of claim 4, wherein dimensions of the second lead end surface and the fourth lead end surface in the thickness direction are more than half of a dimension of the resin side surface in the thickness direction.

7. The semiconductor device of claim 2,
    wherein the second lead exposed portion includes a second lead back surface exposed from the resin back surface,
    wherein the third lead exposed portion includes a third lead back surface exposed from the resin back surface, and
    wherein the fourth lead exposed portion includes a fourth lead back surface exposed from the resin back surface.

8. The semiconductor device of claim 2, further comprising a plurality of second connecting portions bonded to the first electrode and the fourth lead.

9. The semiconductor device of claim 8, wherein the plurality of first connecting portions and the plurality of second connecting portions are wires.

10. The semiconductor device of claim 2,
    wherein the semiconductor element is a transistor, and
    wherein the second electrode is a gate electrode.

11. The semiconductor device of claim 10, wherein the semiconductor element further includes an electron traveling layer made of a nitride semiconductor.

12. The semiconductor device of claim 10, wherein the first electrode is a source electrode.

13. The semiconductor device of claim 10, wherein the first electrode is a drain electrode.

14. An inspection method of inspecting a bonding state of the plurality of first connecting portions of the semiconductor device of claim 2 in a state in which the semiconductor device is mounted on a circuit board, the inspection method comprising:
- a signal input process of inputting a pulse signal to the third lead;
- a voltage detection process of detecting a sense voltage which is a voltage of the fourth lead with respect to the second lead; and
- a comparison process of comparing the sense voltage at a turn-off time of the pulse signal with a threshold voltage.

15. The inspection method of claim 14, wherein the voltage detection process includes bringing two probes for detecting the sense voltage into contact with the second lead exposed portion and the fourth lead exposed portion, respectively.

16. The inspection method of claim 14, wherein the comparison process includes determining that the bonding state has deteriorated when the sense voltage becomes equal to or less than the threshold voltage.

* * * * *